(12) United States Patent
Kyogoku et al.

(10) Patent No.: US 11,245,017 B2
(45) Date of Patent: Feb. 8, 2022

(54) SEMICONDUCTOR DEVICE, INVERTER CIRCUIT, DRIVE DEVICE, VEHICLE, AND ELEVATOR

(71) Applicant: KABUSHIKI KAISHA TOSHIBA, Minato-ku (JP)

(72) Inventors: Shinya Kyogoku, Nagareyama (JP); Johji Nishio, Machida (JP); Ryosuke Iijima, Setagaya (JP)

(73) Assignee: KABUSHIKI KAISHA TOSHIBA, Minato-ku (JP)

( * ) Notice: Subject to any disclaimer, the term of this patent is extended or adjusted under 35 U.S.C. 154(b) by 71 days.

(21) Appl. No.: 16/791,576

(22) Filed: Feb. 14, 2020

(65) Prior Publication Data

US 2021/0036116 A1 Feb. 4, 2021

(30) Foreign Application Priority Data

Aug. 2, 2019 (JP) .............................. JP2019-143400

(51) Int. Cl.
*H01L 29/423* (2006.01)
*H01L 29/16* (2006.01)
(Continued)

(52) U.S. Cl.
CPC ...... *H01L 29/4236* (2013.01); *H01L 29/0634* (2013.01); *H01L 29/1045* (2013.01);
(Continued)

(58) Field of Classification Search
CPC ............ H01L 29/4236; H01L 29/1608; H01L 29/7813; H01L 29/1045; H01L 29/0634;
(Continued)

(56) References Cited

U.S. PATENT DOCUMENTS

2013/0248998 A1 9/2013 Misu et al.
2014/0203356 A1 7/2014 Kagata et al.
(Continued)

FOREIGN PATENT DOCUMENTS

JP 2009-224606 A 10/2009
JP 2012-227324 A 11/2012
(Continued)

*Primary Examiner* — Cuong B Nguyen
(74) *Attorney, Agent, or Firm* — Oblon, McClelland, Maier & Neustadt, L.L.P.

(57) ABSTRACT

A semiconductor device of an embodiment includes a first electrode, a second electrode, a silicon carbide layer between the first electrode and the second electrode, and the silicon carbide layer having a first plane and a second plane, the silicon carbide layer including a first trench, p-type first silicon carbide regions and n-type second silicon carbide regions alternately disposed, a p-type third silicon carbide region between the second silicon carbide region and the first plane, and an n-type fourth silicon carbide region between the third silicon carbide region and the first plane, and a p-type fifth silicon carbide region between the first silicon carbide region and the first trench, a gate electrode in the first trench, and a gate insulating layer. The length of the first silicon carbide region perpendicular to the first plane is longer than a depth of the first trench.

18 Claims, 25 Drawing Sheets

(51) Int. Cl.
  *H01L 29/78* (2006.01)
  *H01L 29/10* (2006.01)
  *H01L 29/06* (2006.01)

(52) U.S. Cl.
  CPC ...... *H01L 29/1095* (2013.01); *H01L 29/1608* (2013.01); *H01L 29/7813* (2013.01)

(58) Field of Classification Search
  CPC ............ H01L 29/1095; H01L 29/7806; H01L 29/0878; H01L 29/41766; H01L 29/66068; H01L 29/045; H01L 29/0623; H01L 29/0696
  See application file for complete search history.

(56) References Cited

U.S. PATENT DOCUMENTS

2018/0076285 A1    3/2018  Tanaka et al.
2018/0097069 A1*   4/2018  Utsumi ............... H01L 29/7813

FOREIGN PATENT DOCUMENTS

| JP | 2013-201268 A | 10/2013 |
| JP | 5849882 B2 | 2/2016 |
| WO | WO 2016/157606 A1 | 10/2016 |

* cited by examiner

SEMICONDUCTOR DEVICE, INVERTER CIRCUIT, DRIVE DEVICE, VEHICLE, AND ELEVATOR

CROSS-REFERENCE TO RELATED APPLICATION

This application is based upon and claims the benefit of priority from Japanese Patent Application No. 2019-143400, filed on Aug. 2, 2019, the entire contents of which are incorporated herein by reference.

FIELD

Embodiments described herein relate generally to a semiconductor device, an inverter circuit, a drive device, a vehicle, and an elevator.

BACKGROUND

Silicon carbide (SiC) is expected to be a material for a next-generation semiconductor device. Silicon carbide has excellent physical properties, such as about triple the band gap, about ten times the breakdown field strength, and about triple the thermal conductivity of silicon (Si). By utilizing the physical properties, a semiconductor device having low loss and capable of operating at high temperature can be realized.

In order for a vertical metal oxide semiconductor field effect transistor (MOSFET) to have a structure for a high breakdown voltage and low on-resistance, a super junction structure (hereinafter, also referred to as an "SJ structure") in which a p-type region and an n-type region are alternately arranged is used. The SJ structure relaxes the electric field strength in the semiconductor with a depletion layer extending in the lateral direction in the p-type region and the n-type region, and the SJ structure achieves a high breakdown voltage of the MOSFET. At the same time, by increasing the concentration of the impurity region, low on-resistance of the MOSFET can be achieved.

DETAILED DESCRIPTION

Figure 1:
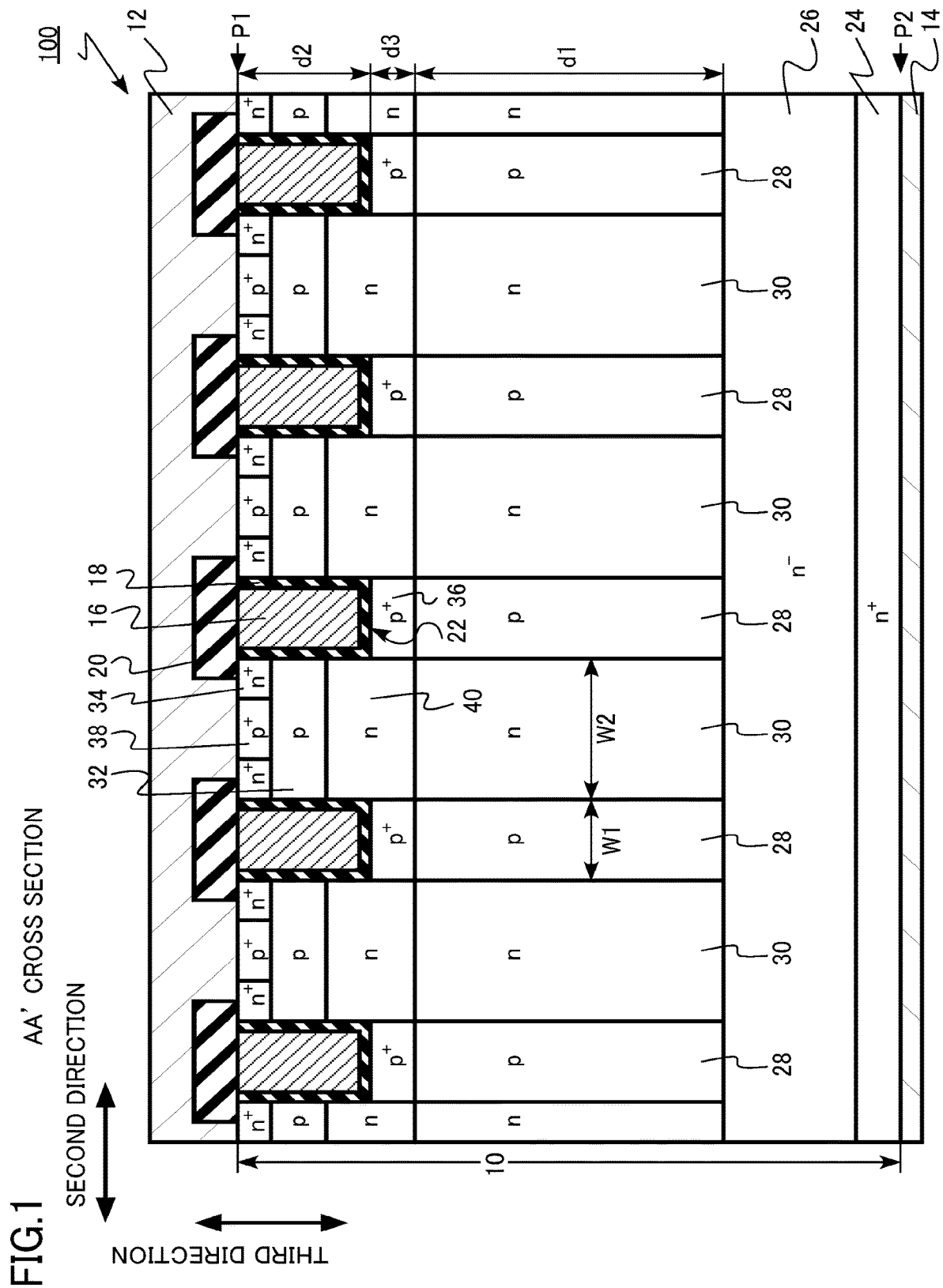
FIG. 1 is a schematic sectional view of a semiconductor device of a first embodiment.

A semiconductor device of an embodiment includes a first electrode; a second electrode; a silicon carbide layer positioned between the first electrode and the second electrode, the silicon carbide layer having a first plane parallel to a first direction and a second direction intersecting the first direction, and a second plane parallel to the first direction and the second direction, the second plane facing the first plane, and the silicon carbide layer including: a first trench positioned on a first plane side, the first trench extending in the first direction on the first plane; first silicon carbide regions of p-type and second silicon carbide regions of n-type alternately disposed in the second direction; a third silicon carbide region of p-type positioned between at least one of the second silicon carbide regions and the first plane; an fourth silicon carbide region of n-type positioned between the third silicon carbide region and the first plane; and a fifth silicon carbide region of p-type positioned between at least one of the first silicon carbide regions and the first trench, the fifth silicon carbide region having p-type impurity concentration higher than p-type impurity concentration of the at least one of the first silicon carbide regions; a gate electrode positioned in the first trench; and a gate insulating layer positioned between the gate electrode and the silicon carbide layer, wherein a length of the at least one of the first silicon carbide regions in a third direction perpendicular to the first plane is longer than a depth of the first trench in the third direction.

Hereinafter, embodiments of the present disclosure will be described with reference to the drawings. Note that, in the following description, the same reference signs are assigned to the same or similar members and the like, and the description of the member that has been described will be appropriately omitted.

In the following description, the notations of n, and n⁻, and p⁺, p, and p⁻ represent relative levels of the impurity concentration in each conductive type. That is, n⁺ has a relatively higher n⁻-type impurity concentration than n, and n⁻ has a relatively lower n⁻-type impurity concentration than n. Furthermore, p⁺ has a relatively higher p⁻-type impurity concentration than p, and p⁻ has a relatively lower p⁻-type impurity concentration than p. Note that, an n⁺-type and an n⁻-type will be also simply referred to as an n-type, and a p⁺-type and a p⁻-type will be also simply referred to as a p-type.

The impurity concentration can be measured by, for example, the secondary ion mass spectrometry (SIMS). In addition, the relative level of the impurity concentration can be determined from the level of the carrier concentration obtained by, for example, the scanning capacitance microscopy (SCM). The distance, such as the width and depth, of the impurity region can be obtained by, for example, the SIMS. Alternatively, the distance, such as the width and depth, of the impurity region can be obtained by, for example, an SCM image.

The depth of a trench, the thickness of an insulating layer, and the like can be measured, for example, on a SIMS or transmission electron microscope (TEM) image.

In this specification, "p-type impurity concentration" of a p-type silicon carbide region means the net p-type impurity concentration obtained by subtracting n-type impurity concentration of the region from p-type impurity concentration of the region. In addition, "n-type impurity concentration" of an n-type silicon carbide region means the net n-type impurity concentration obtained by subtracting p-type impurity concentration of the region from n-type impurity concentration of the region.

First Embodiment

A semiconductor device of a first embodiment includes a first electrode; a second electrode; a silicon carbide layer positioned between the first electrode and the second electrode, the silicon carbide layer having a first plane parallel to a first direction and a second direction intersecting the first direction, and a second plane parallel to the first direction and the second direction, the second plane facing the first plane, and the silicon carbide layer including: a first trench positioned on a first plane side, the first trench extending in the first direction on the first plane; first silicon carbide regions of p-type and second silicon carbide regions of n-type alternately disposed in the second direction; a third silicon carbide region of p-type positioned between at least one of the second silicon carbide regions and the first plane; an fourth silicon carbide region of n-type positioned between the third silicon carbide region and the first plane; and a fifth silicon carbide region of p-type positioned between at least one of the first silicon carbide regions and the first trench, the fifth silicon carbide region having p-type impurity concentration higher than p-type impurity concentration of the at least one of the first silicon carbide regions; a gate electrode positioned in the first trench; and a gate insulating layer positioned between the gate electrode and the silicon carbide layer, wherein a length of the at least one of the first silicon carbide regions in a third direction perpendicular to the first plane is longer than a depth of the first trench in the third direction.

FIG. 1 is a schematic sectional view of a semiconductor device of a first embodiment. The semiconductor device of the first embodiment is a trench-gate-type vertical MOSFET 100 using silicon carbide. The MOSFET 100 is an n-channel MOSFET using electrons as carriers. The MOSFET 100 has a super junction structure (SJ structure).

Figure 2:
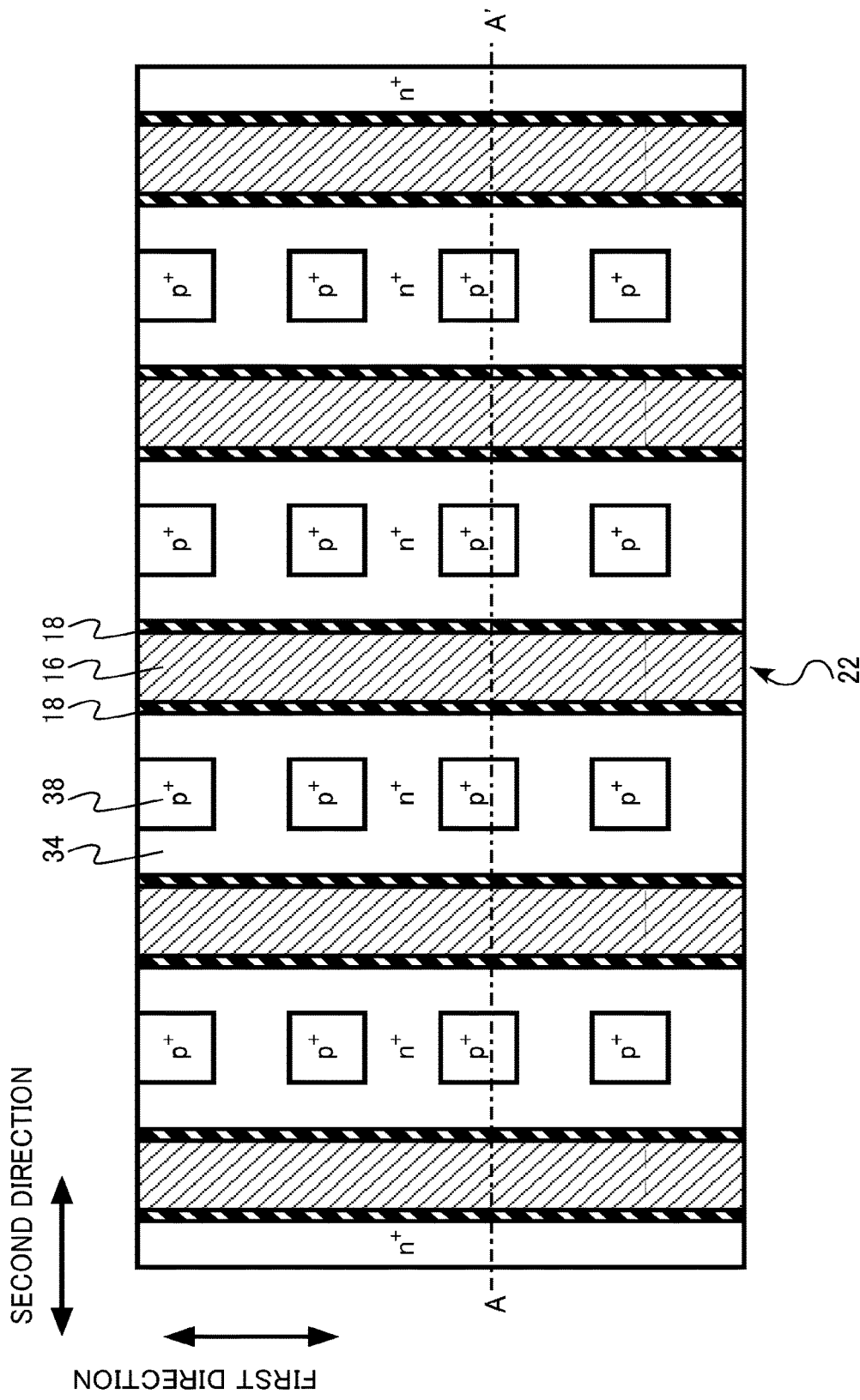
FIG. 2 is a schematic plan view of the semiconductor device of the first embodiment.
Figure 3:
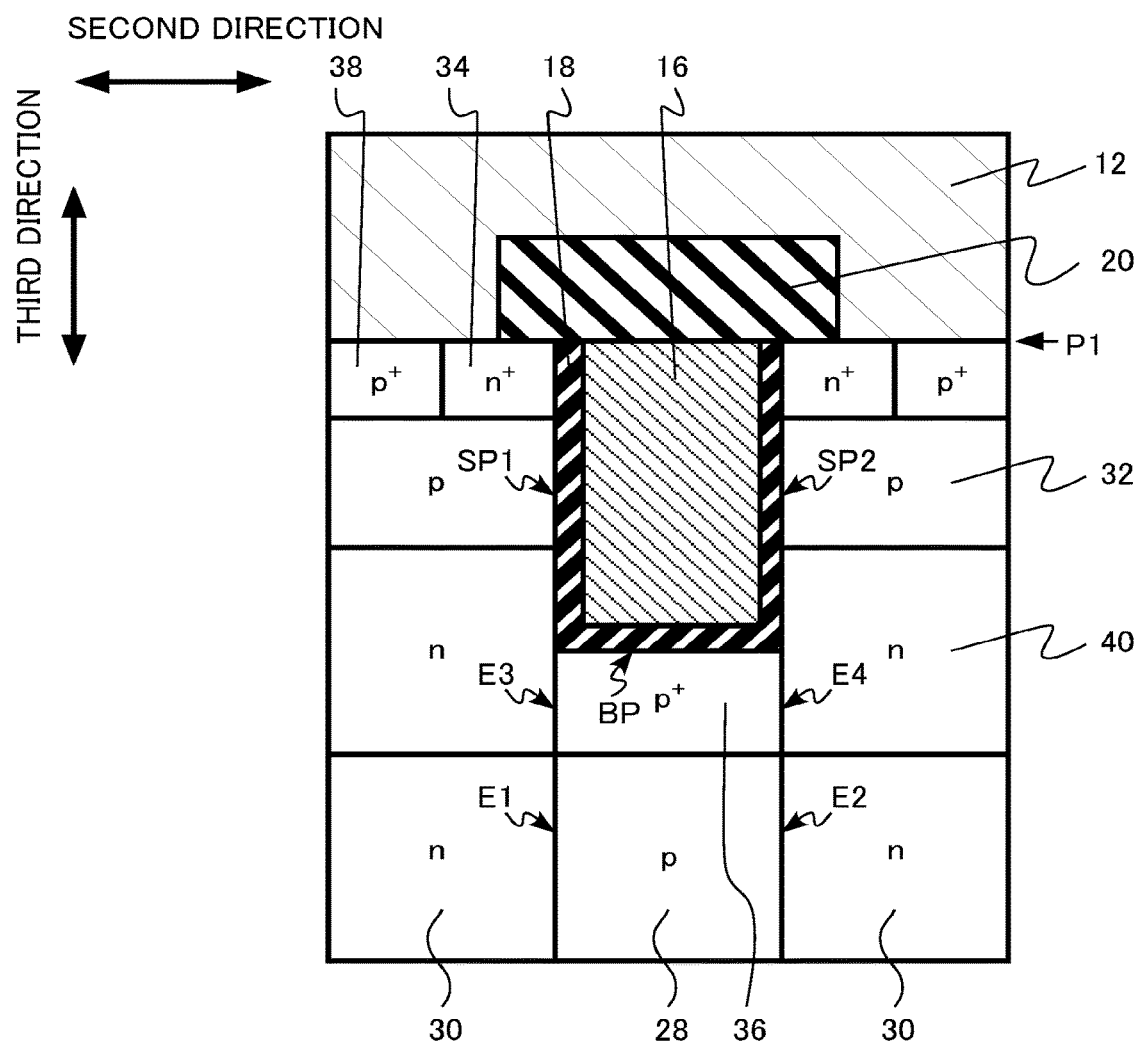
FIG. 3 is an enlarged schematic sectional view of a part of the semiconductor device of the first embodiment.

FIG. 2 is a schematic plan view of the semiconductor device of the first embodiment. FIG. 2 is the plan view of a first plane (P1 in FIG. 1) of FIG. 1. FIG. 1 is a cross sectional view taken along the line AA' of FIG. 2. FIG. 3 is an enlarged schematic sectional view of a part of the semiconductor device of the first embodiment.

The MOSFET 100 includes a silicon carbide layer 10, a source electrode 12 (a first electrode), a drain electrode 14 (a second electrode), a gate electrode 16, a gate insulating layer 18, and an interlayer insulating layer 20.

The silicon carbide layer 10 includes a gate trench (a first trench), an n⁺-type drain region 24 (a ninth silicon carbide region), an n⁻-type drift region 26 (an eighth silicon carbide region), a p-type p-pillar region 28 (a first silicon carbide region), an n⁻ type n-pillar region 30 (a second silicon carbide region), a p-type body region 32 (a third silicon carbide region), an n⁺-type source region 34 (a fourth silicon carbide region), a p⁺-type electric field relaxation region 36 (a fifth silicon carbide region), a p⁺-type contact region 38, and an n-type current spreading region 40 (a seventh silicon carbide region).

The silicon carbide layer 10 is positioned between the source electrode 12 and the drain electrode 14. The silicon carbide layer 10 includes a first plane ("P1" in FIG. 1) and a second plane ("P2" in FIG. 1). Hereinafter, the first plane P1 is also referred to as a front face, and the second plane P2 is also referred to as a rear face. The second plane P2 faces the first plane P1.

A first direction and a second direction are parallel to the first plane P1. The second direction intersects the first direction. The second direction is, for example, perpendicular to the first direction. A third direction is perpendicular to the first plane. The third direction is perpendicular to the first direction and the second direction.

Hereinafter, the term "depth" means a depth from the first plane P1. The term "thickness" means a length in the third direction.

The silicon carbide layer 10 is single crystal SiC. The silicon carbide layer 10 is, for example, 4H—SiC. The thickness of the silicon carbide layer 10 is, for example, 5 µm or more and 500 µm or less.

The first plane P1 is, for example, inclined from 0 degree or more and 8 degrees or less with respect to a (0001) plane. That is, the first plane P1 is a plane obtained by inclining its normal line from 0 degree or more and 8 degrees or less with respect to a c-axis in a [0001] direction. In other words, the off angle with respect to the (0001) plane is 0 degree or more and 8 degrees or less. The second plane P2 is, for example, inclined from 0 degree or more and 8 degrees or less with respect to a (000-1) plane.

The (0001) plane is called a silicon face. The (000-1) plane is called a carbon face. The inclination direction of the first plane P1 and the second plane P2 is, for example, a [11-20] direction. The [11-20] direction is an a-axis direction. In FIG. 1, the second direction shown in the drawing is the a-axis direction, for example.

The gate trench 22 is in the silicon carbide layer 10. The gate trench 22 is positioned on the first plane P1 side of the silicon carbide layer 10. The gate trench 22 is a groove formed in the silicon carbide layer 10.

The gate trench 22 extends in the first direction as shown in FIG. 2. The gate trench 22 is repeatedly disposed in the second direction as shown in FIG. 2. The repetition pitch of the gate trench 22 in the second direction is, for example, 1 µm or more and 5 µm or less. The depth of the gate trench 22 is, for example, 1 µm or more and 2 µm or less. The width of the gate trench 22 in the second direction is, for example, 0.5 µm or more and 1 µm or less.

As shown in FIG. 3, the gate trench 22 has a first side plane SP1, a second side plane SP2, and a bottom plane BP. The bottom plane BP is positioned between the first side plane SP1 and the second side plane SP2.

The gate electrode 16 is positioned in the gate trench 22. The gate electrode 16 is provided between the source electrode 12 and the drain electrode 14. The gate electrode 16 extends in the first direction.

The gate electrode 16 is a conductive layer. The gate electrode 16 is, for example, polycrystalline silicon containing a p-type impurity or an n-type impurity.

The gate insulating layer 18 is positioned between the gate electrode 16 and the silicon carbide layer 10. The gate insulating layer 18 is provided between the source region 34 and the gate electrode 16, the body region 32 and the gate electrode 16, the current spreading region 40 and the gate electrode 16, and the electric field relaxation region 36 and the gate electrode 16.

The gate insulating layer 18 is, for example, a silicon oxide film. To the gate insulating layer 18, a high-k insulating film (a high dielectric constant insulating film, such as HfSiON, ZrSiON, AlON, or the like) is applicable, for example. Alternatively, a stacked film of a silicon oxide film ($SiO_2$) and a high-k insulating film is also applicable to the gate insulating layer 18, for example.

The interlayer insulating layer 20 is provided on the gate electrode 16. The interlayer insulating layer 20 is, for example, a silicon oxide film. The interlayer insulating layer 20 electrically separates the gate electrode 16 from the source electrode 12.

The source electrode 12 is provided on the first plane P1 side of the silicon carbide layer 10. The source electrode 12 is provided on the first plane P1 of the silicon carbide layer 10. The source electrode 12 is in contact with the source region 34 and the contact region 38.

The source electrode 12 contains metal. The metal forming the source electrode 12 has a stacked structure of, for example, titanium (Ti) and aluminum (Al). The source electrode 12 may contain metal silicide or metal carbide in contact with the silicon carbide layer 10.

The drain electrode 14 is provided on the second plane P2 side of the silicon carbide layer 10. The drain electrode 14 is provided on the second plane P2 of the silicon carbide layer 10. The drain electrode 14 is in contact with the drain region 24.

The drain electrode 14 is, for example, metal or a metal semiconductor compound. The drain electrode 14 contains, for example, a material selected from the group including nickel silicide (NiSi), titanium (Ti), nickel (Ni), silver (Ag), and gold (Au).

The $n^+$-type drain region 24 is provided on the second plane P2 side of the silicon carbide layer 10. The drain region 24 is positioned between the second plane P2 and the p-pillar region 28, and the second plane P2 and the n-pillar region 30.

The drain region 24 contains, for example, nitrogen (N) as an n-type impurity. The n-type impurity concentration of the drain region 24 is higher than the n-type impurity concentration of the n-pillar region 30. The n-type impurity concentration of the drain region 24 is, for example, $1 \times 10^{18}$ cm$^{-3}$ or more and $1 \times 10^{21}$ cm$^{-3}$ or less.

The $n^-$-type drift region 26 is provided on the drain region 24. The drift region 26 is positioned between the second plane P2 and the p-pillar region 28, and the second plane P2 and the n-pillar region 30. The n-type impurity concentration of the drift region 26 is equal to or lower than the n-type impurity concentration of the n-pillar region 30. For example, the n-type impurity concentration of the drift region 26 is lower than the n-type impurity concentration of the n-pillar region 30.

The drift region 26 contains, for example, nitrogen (N) as an n-type impurity. The n-type impurity concentration of the drift region 26 is, for example, $4 \times 10^{14}$ cm$^{-3}$ or more and $1 \times 10^{18}$ cm$^{-3}$ or less.

The p-type p-pillar region 28 and the n-type n-pillar region 30 are provided between the drain region 24 and the first plane P1. The p-pillar region 28 and the n-pillar region 30 are provided between the drift region 26 and the first plane P1.

The p-pillar regions 28 and the n-pillar regions 30 are alternately disposed in the second direction. The p-pillar regions 28 and the n-pillar regions 30 form what is called a super junction structure (SJ structure). When the MOSFET 100 having an SJ structure is turned off, a depletion layer extends in the lateral direction (second direction) in the p-pillar region 28 and the n-pillar region 30. Since the depletion layer extends in the lateral direction, the electric field strength in the silicon carbide layer 10 is relaxed, and a high breakdown voltage is achieved.

The p-pillar region 28 contains, for example, aluminum (Al) as a p-type impurity. The p-type impurity concentration of the p-pillar region 28 is, for example, $5 \times 10^{15}$ cm$^{-3}$ or more and $5 \times 10^{17}$ cm$^{-3}$ or less.

The n-pillar region 30 contains, for example, nitrogen (N) as an n-type impurity. The n-type impurity concentration of the n-pillar region 30 is, for example, $5 \times 10^{15}$ cm$^{-3}$ or more and $5 \times 10^{17}$ cm$^{-3}$ or less.

For example, when the width of the p-pillar region 28 in the second direction is W1, the p-type impurity concentration of the p-pillar region 28 is N1, the width of the n-pillar region 30 in the second direction is W2, and the n-type impurity concentration of the n-pillar region 30 is N2, the relationship of the following expression is satisfied.

$$0.8 \leq (W1 \times N1)/(W2 \times N2) \leq 1.2$$

The length of the p-pillar region 28 in the third direction perpendicular to the first plane (d1 in FIG. 1) is longer than the depth of the gate trench 22 in the third direction (d2 in FIG. 1). The aspect ratio (d1/W1) of the length d1 of the p-pillar region 28 in the third direction to the width of the p-pillar region 28 in the second direction (W1 in FIG. 1) is, for example, 3 or more and 10 or less. The length d1 of the p-pillar region 28 in the third direction perpendicular to the first plane is, for example, 3 µm or more and 20 µm or less.

The $p^+$-type electric field relaxation region 36 is positioned between the p-pillar region 28 and the gate trench 22. The electric field relaxation region 36 is in contact with the bottom plane BP of the gate trench 22. The electric field relaxation region 36 is in contact with the gate insulating layer 18. The electric field relaxation region 36 is in contact with the p-pillar region 28.

The electric field relaxation region 36 has a function of relaxing the electric field applied to the gate insulating layer 18 when the MOSFET 100 is turned off. The electric field relaxation region 36 is fixed at the same potential as, for example, the source electrode 12.

The electric field relaxation region 36 contains, for example, aluminum (Al) as a p-type impurity. The p-type impurity concentration of the electric field relaxation region 36 is higher than the p-type impurity concentration of the p-pillar region 28. The p-type impurity concentration of the electric field relaxation region 36 is, for example, 10 times or more the p-type impurity concentration of the p-pillar region 28. The p-type impurity concentration of the electric field relaxation region 36 is, for example, $5 \times 10^{17}$ cm$^{-3}$ or more and $5 \times 10^{19}$ cm$^{-3}$ or less.

The length of the electric field relaxation region 36 in the third direction (d3 in FIG. 1) is shorter than the length d1 of the p-pillar region 28 in the third direction. The length d3 of the electric field relaxation region 36 in the third direction is, for example, 0.5 μm or less.

The position shift amount of both ends of the p-pillar region 28 in the second direction (the end E1 and the end E2 in FIG. 3) from both side planes of the gate trench 22 in the second direction (the first side plane SP1 and the second side plane SP2 in FIG. 3) is, for example, ±0.1 μm or less. In the position shift amount, for example, it is assumed to be positive when the p-pillar region 28 is shifted from the gate trench 22 to the right in FIG. 3, and to be negative when the p-pillar region 28 is shifted to the left.

For example, the position shift amount of the end E1 of the p-pillar region 28 from the first side plane SP1 of the gate trench 22 is, for example, within ±0.1 μm or less. FIG. 3 shows that the position shift amount of the end E1 of the p-pillar region 28 from the first side plane SP1 of the gate trench 22 is zero.

Furthermore, for example, the position shift amount of the end E2 of the p-pillar region 28 from the second side plane SP2 of the gate trench 22 is, for example, within ±0.1 μm or less. FIG. 3 shows that the position shift amount of the end E2 of the p-pillar region 28 from the second side plane SP2 of the gate trench 22 is zero.

The position shift amount of both ends of the electric field relaxation region 36 in the second direction (the end E3 and the end E4 in FIG. 3) from both side planes of the gate trench 22 in the second direction (the first side plane SP1 and the second side plane SP2 in FIG. 3) is, for example, ±0.1 μm or less. In the position shift amount, for example, it is assumed to be positive when the electric field relaxation region 36 is shifted to the right in FIG. 3 from the gate trench 22, and to be negative when the electric field relaxation region 36 is shifted to the left.

For example, the position shift amount of the end E3 of the electric field relaxation region 36 from the first side plane SP1 of the gate trench 22 is, for example, within ±0.1 μm or less. FIG. 3 shows that the position shift amount of the end E3 of the electric field relaxation region 36 from the first side plane SP1 of the gate trench 22 is zero.

Furthermore, for example, the position shift amount of the end E4 of the electric field relaxation region 36 from the second side plane SP2 of the gate trench 22 is, for example, within ±0.1 μm or less. FIG. 3 shows that the position shift amount of the end E4 of the electric field relaxation region 36 from the second side plane SP2 of the gate trench 22 is zero.

Note that, for example, when the first side plane SP1 or the second side plane SP2 of the gate trench 22 has a tapered shape, the position of the first side plane SP1 or the second side plane SP2 is based on the position at which the first side plane SP1 or the second side plane SP2 intersects the bottom plane BP.

For example, when the position of the end E1 of the p-pillar region 28 in the second direction is varied, the maximum value of the position shift amount from the first side plane SP1 of the gate trench 22 is ±0.1 μm or less. Similarly, when the position of the end E2 of the p-pillar region 28 in the second direction is varied, the maximum value of the position shift amount from the second side plane SP2 of the gate trench 22 is ±0.1 μm or less.

In addition, for example, when the position of the end E3 of the electric field relaxation region 36 in the second direction is unstable, the maximum value of the position shift amount from the first side plane SP1 of the gate trench 22 is ±0.1 μm or less. Similarly, when the position of the end E4 of the electric field relaxation region 36 in the second direction is unstable, the maximum value of the position shift amount from the second side plane SP2 of the gate trench 22 is ±0.1 μm or less.

The p-type body region 32 is positioned between the n-pillar region 30 and the first plane P1. The body region 32 functions as a channel region of the MOSFET 100. For example, when the MOSFET 100 is turned on, a channel through which electrons flow is formed in a region of the body region 32 in contact with the gate insulating layer 18. The region of the body region 32 in contact with the gate insulating layer 18 is a channel formation region.

The body region 32 contains, for example, aluminum (Al) as a p-type impurity. The p-type impurity concentration of the body region 32 is, for example, $5 \times 10^{16}$ cm$^{-3}$ or more and $5 \times 10^{17}$ cm$^{-3}$ or less.

The depth of the body region 32 is shallower than the depth of the gate trench 22. The depth of the body region 32 is, for example, 0.2 μm or more and 1.0 μm or less.

The n$^+$-type source region 34 is positioned between the body region 32 and the first plane P1. The source region 34 is in contact with the source electrode 12. The source region 34 is in contact with the gate insulating layer 18.

The source region 34 contains, for example, phosphorus (P) as an n-type impurity. The n-type impurity concentration of the source region 34 is higher than the n-type impurity concentration of the drift region 26 and the n-pillar region 30. The n-type impurity concentration of the source region 34 is, for example, $1 \times 10^{19}$ cm$^{-3}$ or more and $1 \times 10^{21}$ cm$^{-3}$ or less.

The depth of the source region 34 is shallower than the depth of the body region 32. The depth of the source region 34 is, for example, 0.1 μm or more and 0.3 μm or less. The distance between the current spreading region 40 and the source region 34 in the third direction is, for example, 0.1 μm or more and 0.9 μm or less.

The p$^+$-type contact region 38 is positioned between the body region 32 and the first plane P1. The contact region 38 is in contact with the source electrode 12.

As shown in FIG. 2, the contact region 38 is disposed, for example, in an island shape in the first direction on the first plane P1 so as to sandwich the source region 34. The contact region 38 may have a stripe shape extending in the first direction.

The contact region 38 contains, for example, aluminum (Al) as a p-type impurity. For example, the p-type impurity concentration of the contact region 38 is higher than the p-type impurity concentration of the body region 32.

The p-type impurity concentration of the contact region 38 is, for example, $1 \times 10^{18}$ cm$^{-3}$ or more and $1 \times 10^{21}$ cm$^{-3}$ or less. In addition, the p-type impurity concentration of the contact portion between the contact region 38 and the source electrode 12 is preferably high, and is, for example, $1 \times 10^{19}$ cm$^{-3}$ or more and $1 \times 10^{21}$ cm$^{-3}$ or less.

The n-type current spreading region 40 is positioned between the n-pillar region 30 and the body region 32. The current spreading region 40 has a function of diffusing current mainly in the lateral direction when the MOSFET 100 is operating. The current spreading region 40 is in contact with the n-pillar region 30. The current spreading region 40 is in contact with the body region 32.

The current spreading region 40 contains, for example, nitrogen (N) as an n-type impurity. The n-type impurity concentration of the current spreading region 40 is higher than the n-type impurity concentration of the n-pillar region 30. The n-type impurity concentration of the current spreading region 40 is, for example, 1.5 times or more and 5 times or less the n-type impurity concentration of the n-pillar region 30. The n-type impurity concentration of the current spreading region 40 is, for example, $7 \times 10^{15}$ cm$^{-3}$ or more and $2 \times 10^{18}$ cm$^{-3}$ or less.

The length of the current spreading region 40 in the third direction is shorter than the length of the n-pillar region 30 in the third direction (d1 in FIG. 1). The length of the current spreading region 40 in the third direction is, for example, 0.2 μm or more and 1.0 μm or less.

Next, an example of a method for manufacturing the semiconductor device of the first embodiment will be described.

FIGS. 4, 5, 6, 7, 8, 9, and 10 are schematic sectional views illustrating an example of the manufacturing method for the semiconductor device of the first embodiment. FIGS. 4, 5, 6, 7, 8, 9, and 10 are cross sections corresponding to FIG. 1.

Figure 4:
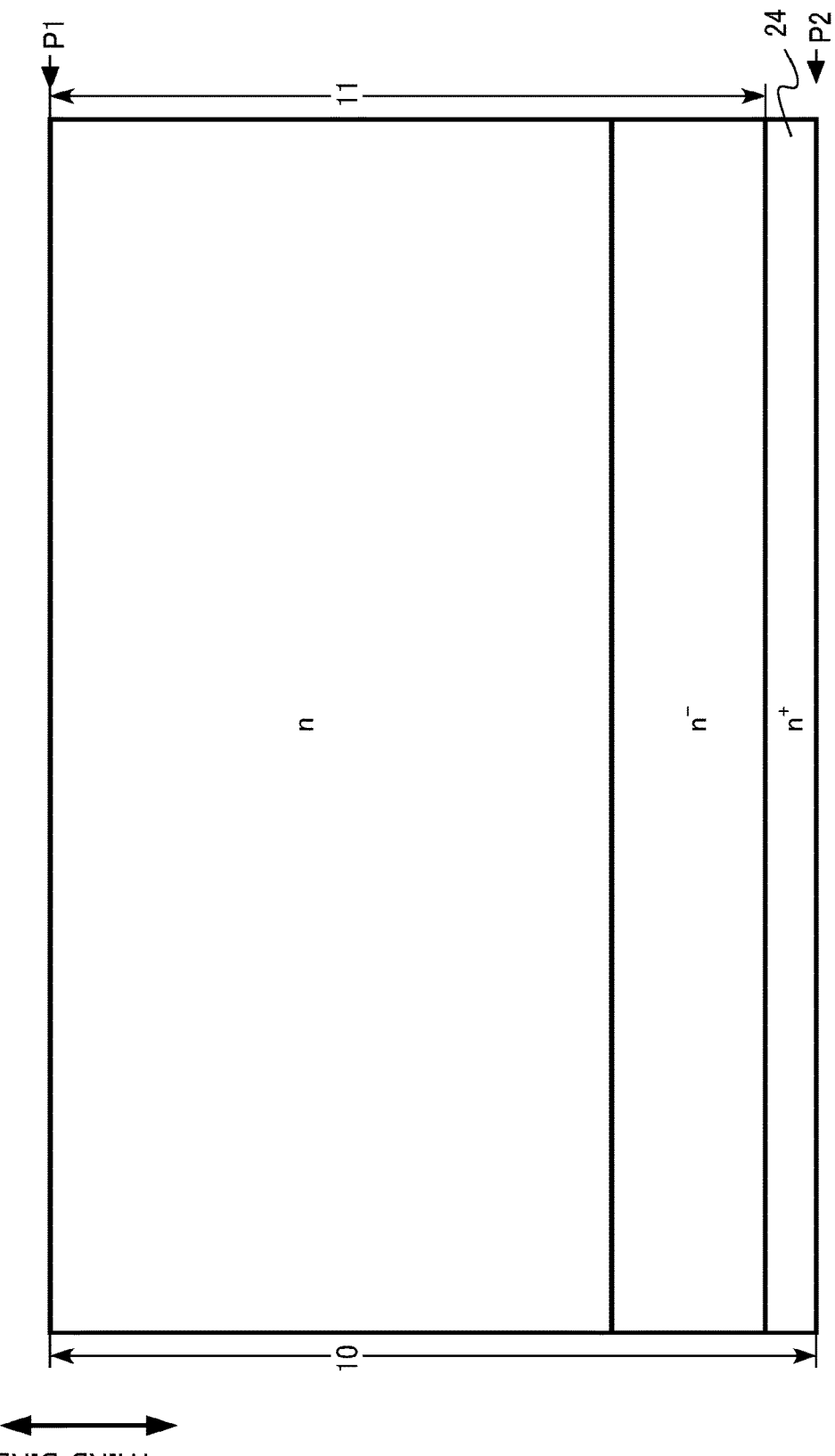
FIG. 4 is a schematic sectional view illustrating an example of a method for manufacturing the semiconductor device of the first embodiment.

First, a silicon carbide layer 10 including an type drain region 24 and an n$^-$-type and n-type epitaxial layer 11 formed by epitaxial growth on the drain region 24 is prepared (FIG. 4). A part of the epitaxial layer 11 finally becomes a drift region 26 and an n-pillar region 30.

Figure 5:
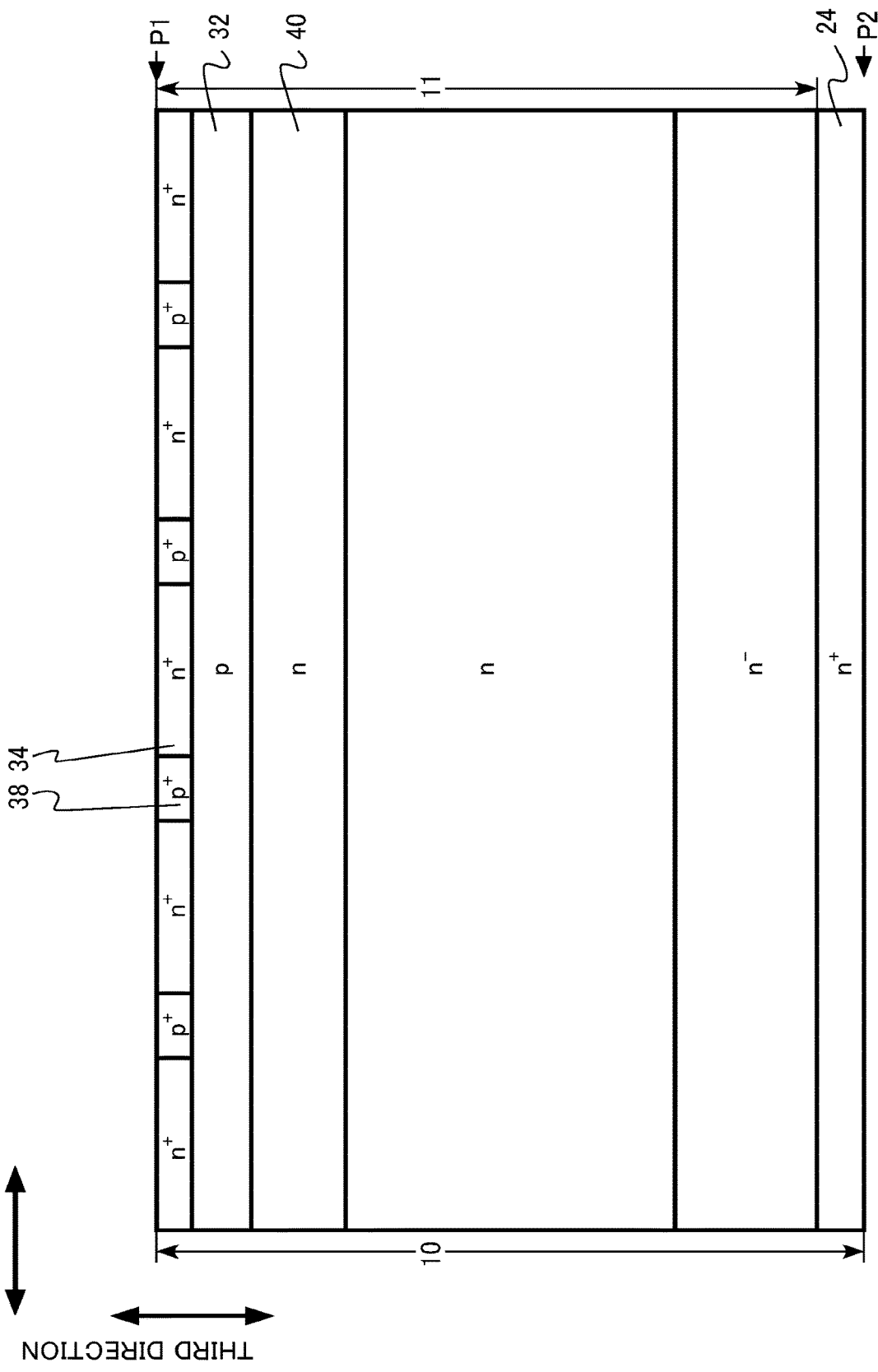
FIG. 5 is a schematic sectional view illustrating the example of the method for manufacturing the semiconductor device of the first embodiment.

Next, an n-type current spreading region 40, a p-type body region 32, an n$^+$-type source region 34, and a type contact region 38 are formed in the epitaxial layer 11 by ion implantation (FIG. 5).

Figure 6:
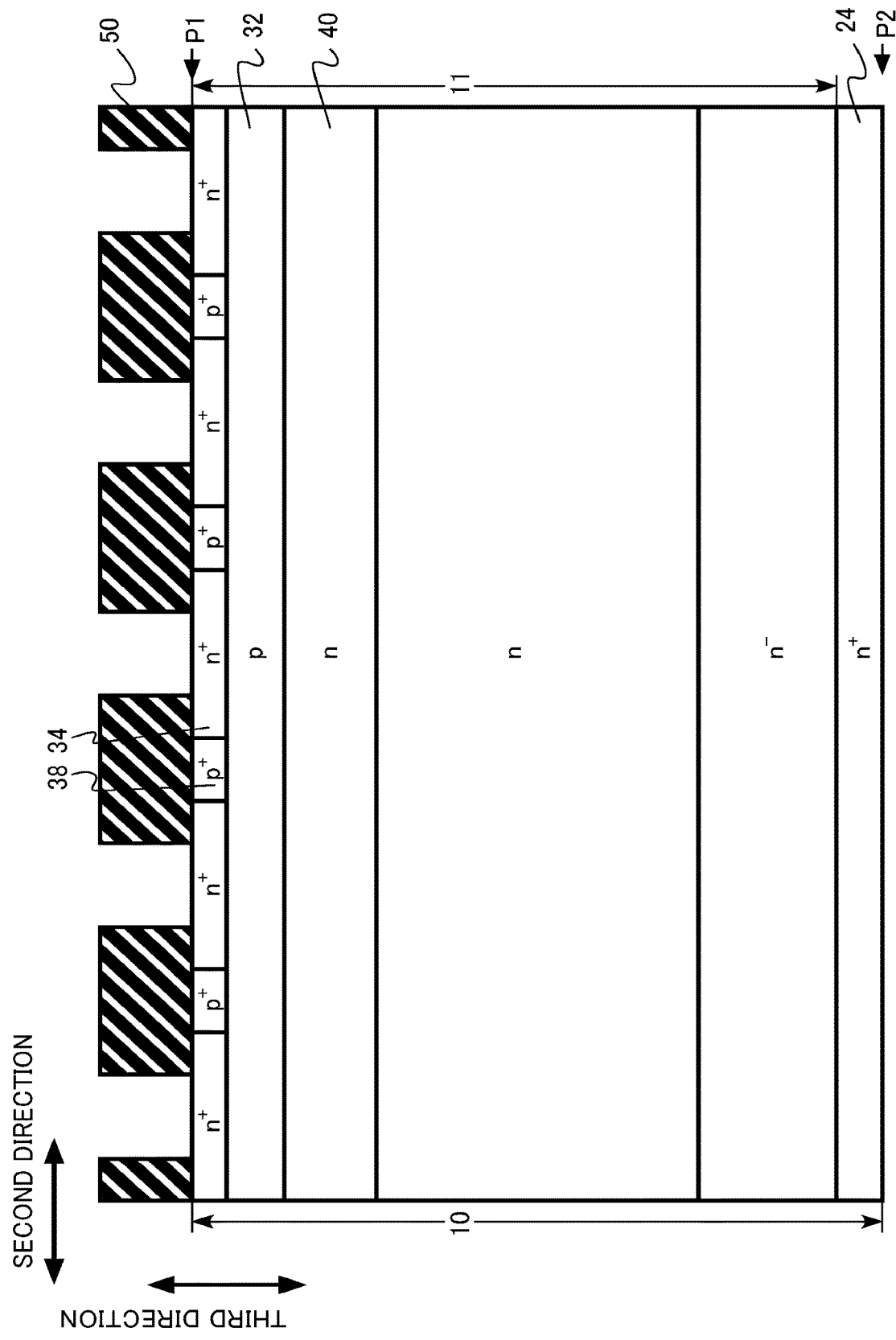
FIG. 6 is a schematic sectional view illustrating the example of the method for manufacturing the semiconductor device of the first embodiment.

Then, a mask material 50 is formed on the surface of the epitaxial layer 11 by a known process technique (FIG. 6). The mask material 50 is, for example, a silicon oxide film.

Figure 7:
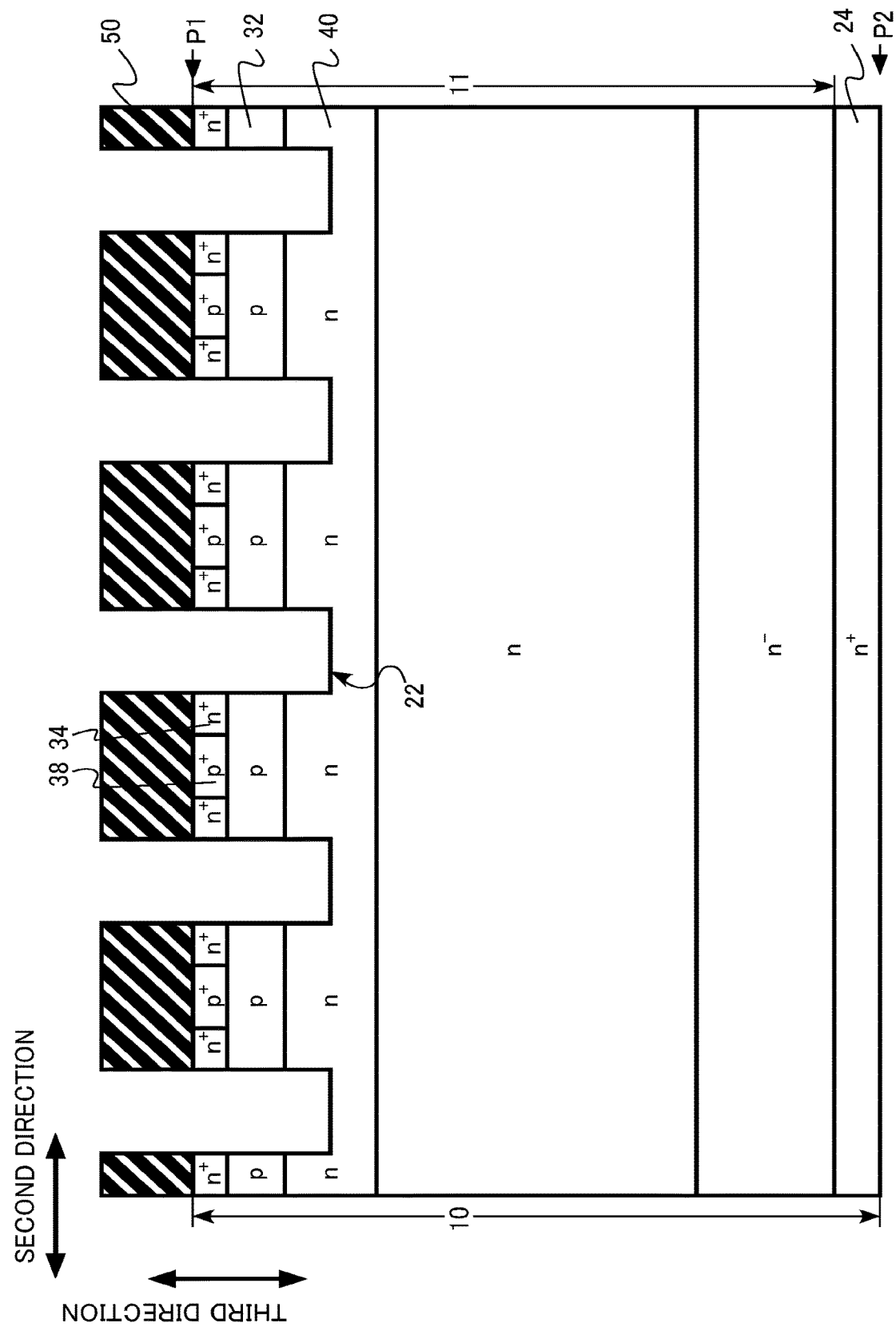
FIG. 7 is a schematic sectional view illustrating the example of the method for manufacturing the semiconductor device of the first embodiment.

Then, a gate trench 22 is formed by a known reactive ion etching method using the mask material 50 as a mask (FIG. 7). The gate trench 22 is formed so as to pass through the source region 34, the body region 32, and the current spreading region 40.

Figure 8:
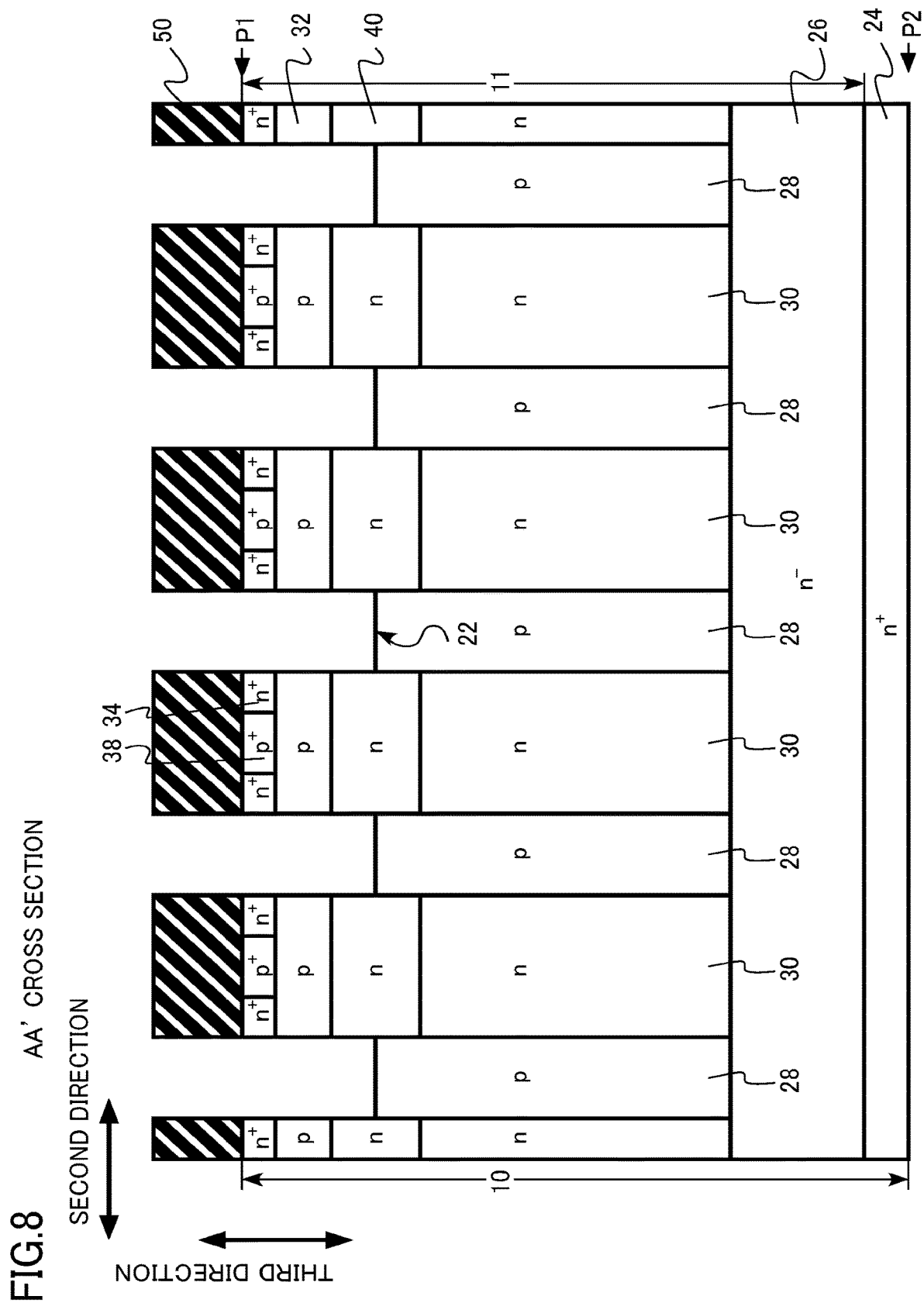
FIG. 8 is a schematic sectional view illustrating the example of the method for manufacturing the semiconductor device of the first embodiment.

Next, a p-type p-pillar region 28 is formed by ion implantation using the mask material 50 as a mask (FIG. 8). The p-pillar region 28 reaches the drift region 26. The p-pillar region 28 is formed below the gate trench 22. A region sandwiched by the adjacent p-pillar regions 28 becomes an n-pillar region 30.

Figure 9:
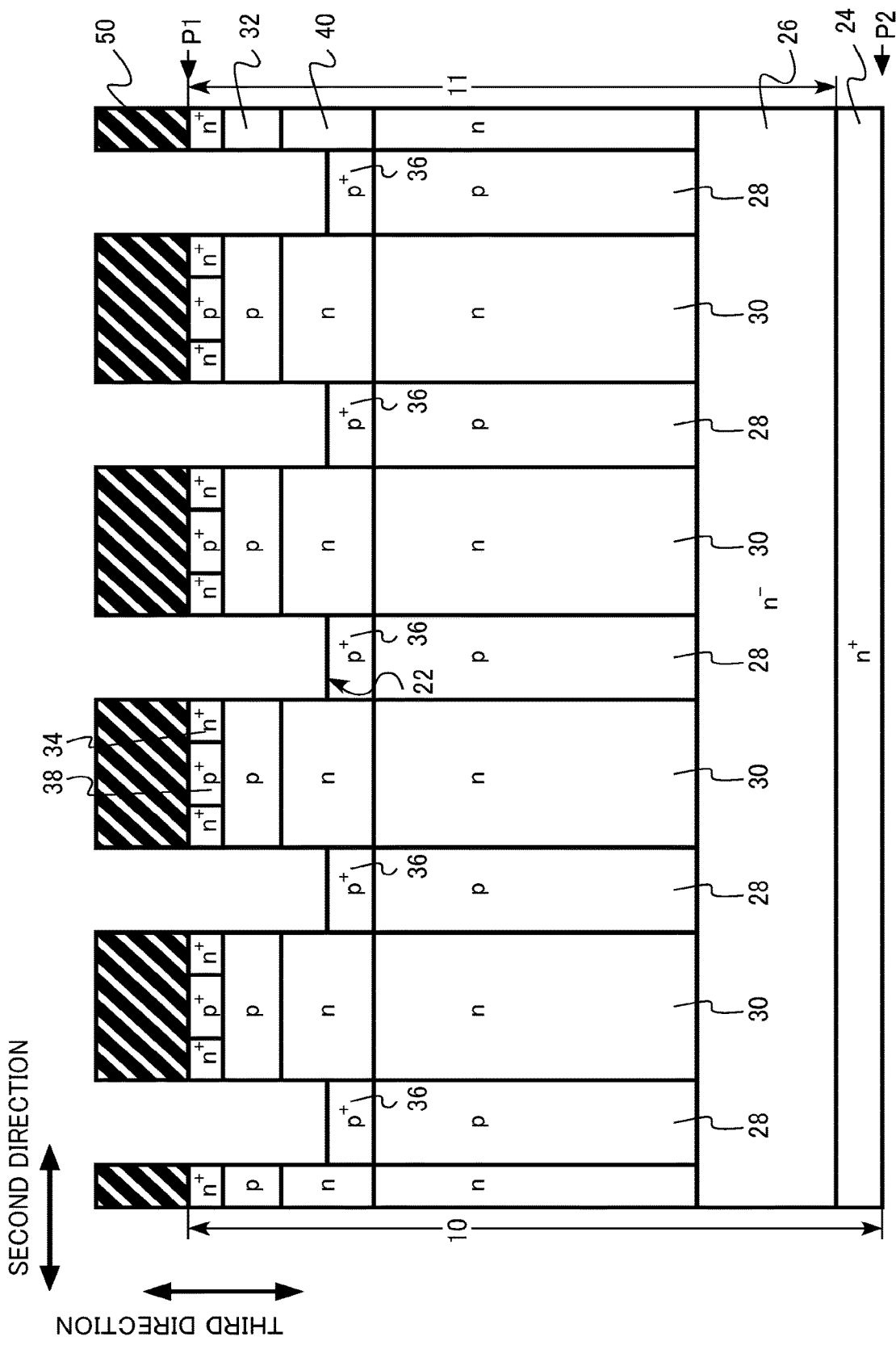
FIG. 9 is a schematic sectional view illustrating the example of the method for manufacturing the semiconductor device of the first embodiment.

Then, a p$^+$-type electric field relaxation region 36 is formed by ion implantation using the mask material 50 as a mask (FIG. 9). The electric field relaxation region 36 is formed between the p-pillar region 28 and the gate trench 22.

The p-pillar region 28 and the electric field relaxation region 36 are formed by ion implantation using the mask material 50 used for forming the gate trench 22 as a mask. Thus, the p-pillar region 28 and the electric field relaxation region 36 are formed in a self-aligned manner (cell alignment) with respect to the gate trench 22.

Thus, it is possible for the position shift amount of both ends of the p-pillar region 28 in the second direction (the end E1 and the end E2 in FIG. 3) from both side planes of the gate trench 22 in the second direction (the first side plane SP1 and the second side plane SP2 in FIG. 3) to be, for example, ±0.1 μm or less. Furthermore, it is possible for the position shift amount of both ends of the electric field relaxation region 36 in the second direction (the end E3 and the end E4 in FIG. 3) from both side planes of the gate trench 22 in the second direction (the first side plane SP1 and the second side plane SP2 in FIG. 3) to be, for example, ±0.1 μm or less.

Figure 10:
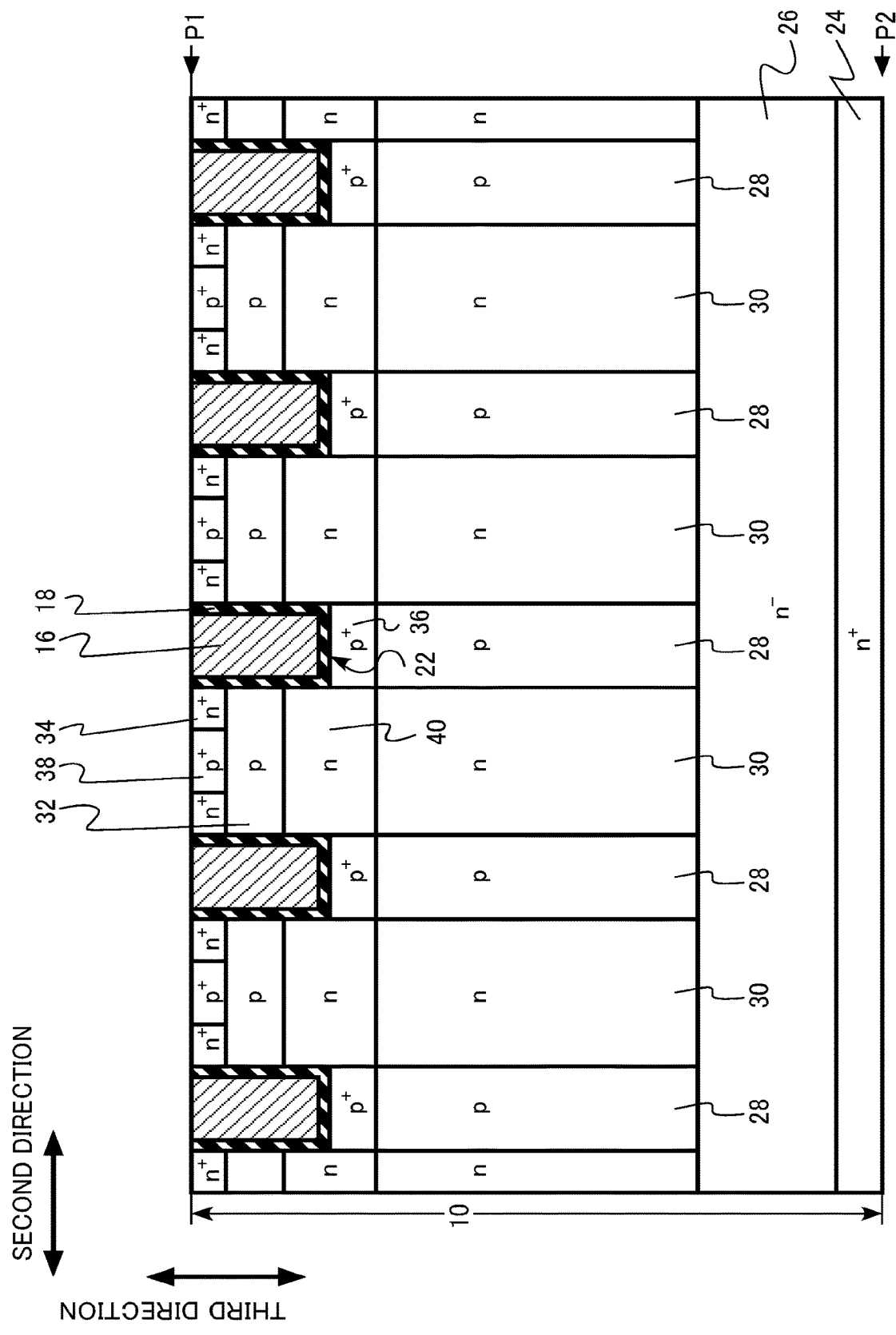
FIG. 10 is a schematic sectional view illustrating the example of the method for manufacturing the semiconductor device of the first embodiment.

Then, a gate insulating layer 18 and a gate electrode 16 are formed in the gate trench 22 by a known process technique (FIG. 10).

Thereafter, an interlayer insulating layer 20, a source electrode 12, and a drain electrode 14 are formed by a known process technique. The MOSFET 100 shown in FIG. 1 is manufactured by the above manufacturing method.

Next, another example of the method for manufacturing the semiconductor device of the first embodiment will be described.

FIGS. 11, 12, 13, 14, 15, and 16 are schematic sectional views illustrating another example of the manufacturing method for the semiconductor device of the first embodiment. FIGS. 11, 12, 13, 14, 15, and 16 are cross sections corresponding to FIG. 1.

First, a silicon carbide layer 10 including an type drain region 24 and an n$^-$-type and n-type epitaxial layer 11 formed by epitaxial growth on the drain region 24 is prepared. A part of the epitaxial layer 11 finally becomes a drift region 26 and an n-pillar region 30.

Figure 11:
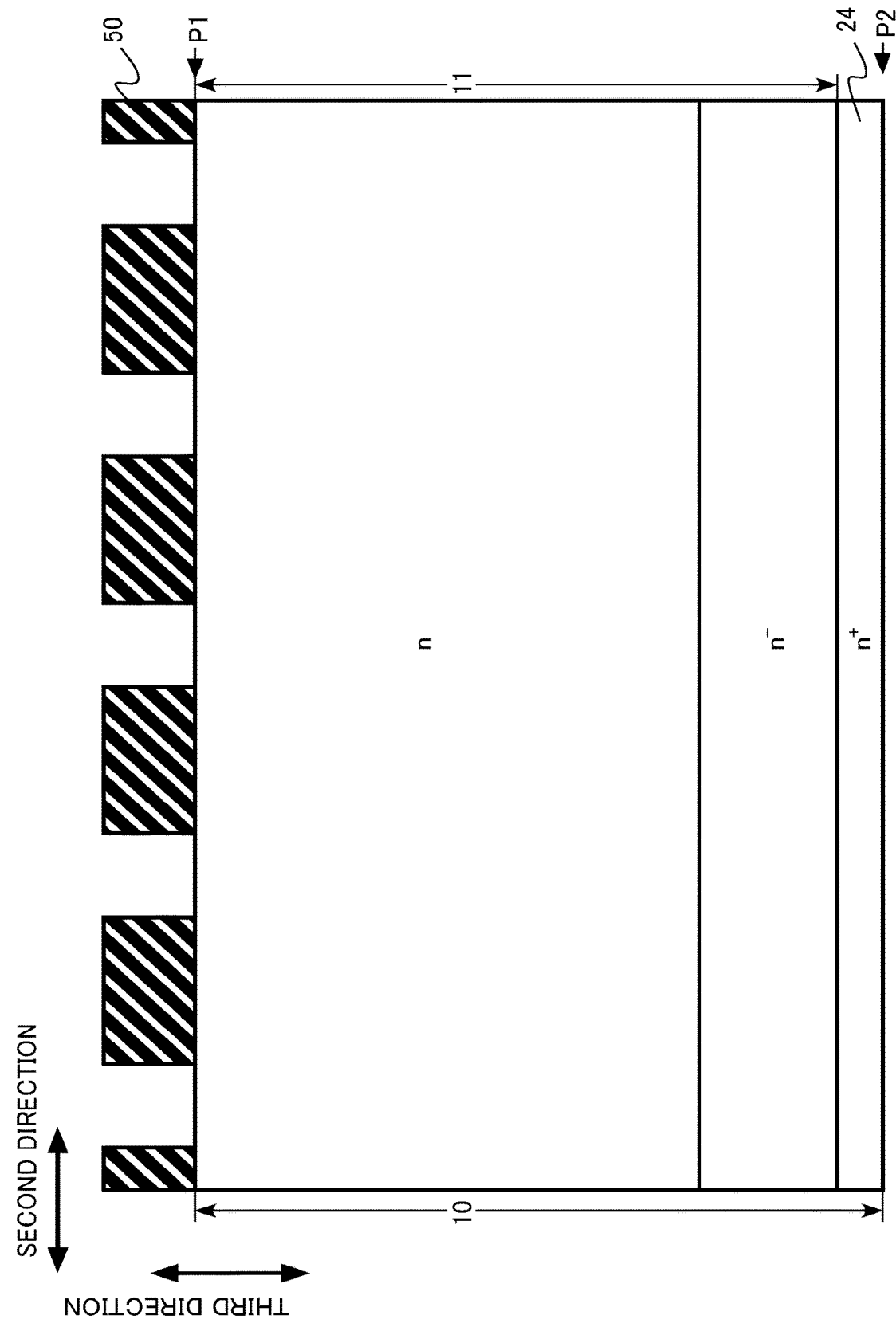
FIG. 11 is a schematic sectional view illustrating another example of the method for manufacturing the semiconductor device of the first embodiment.

Then, a mask material 50 is formed on the surface of the epitaxial layer 11 by a known process technique (FIG. 11). The mask material 50 is, for example, a silicon oxide film.

Figure 12:
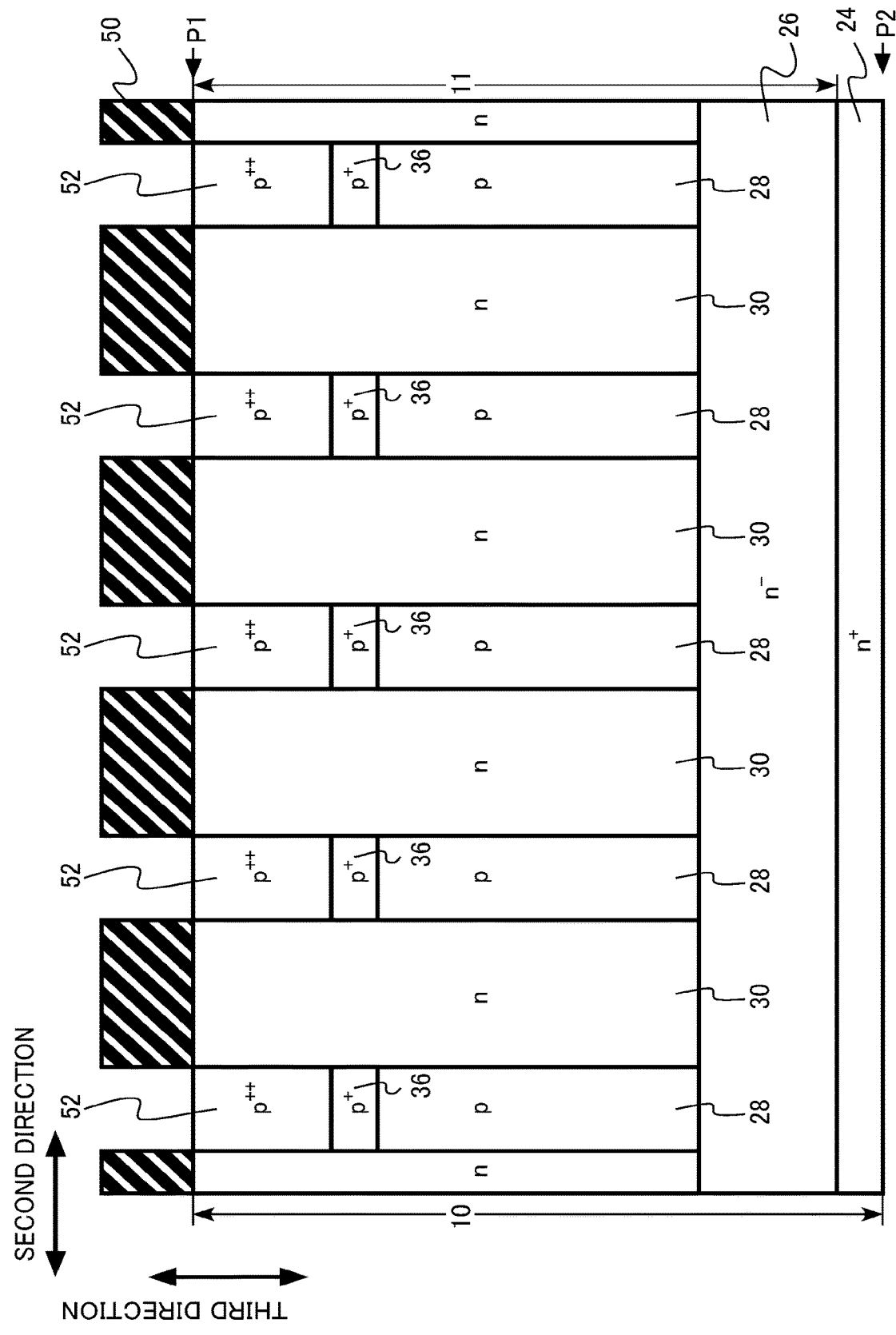
FIG. 12 is a schematic sectional view illustrating the example of the method for manufacturing the semiconductor device of the first embodiment.

Next, a p-type p-pillar region 28, a p$^+$-type electric field relaxation region 36, and a p$^\|$-type high-concentration p-region 52 are formed by ion implantation using the mask material 50 as a mask (FIG. 12). The p-pillar region 28 reaches the drift region 26. A region sandwiched by the adjacent p-pillar regions 28 becomes an n-pillar region 30.

Figure 13:
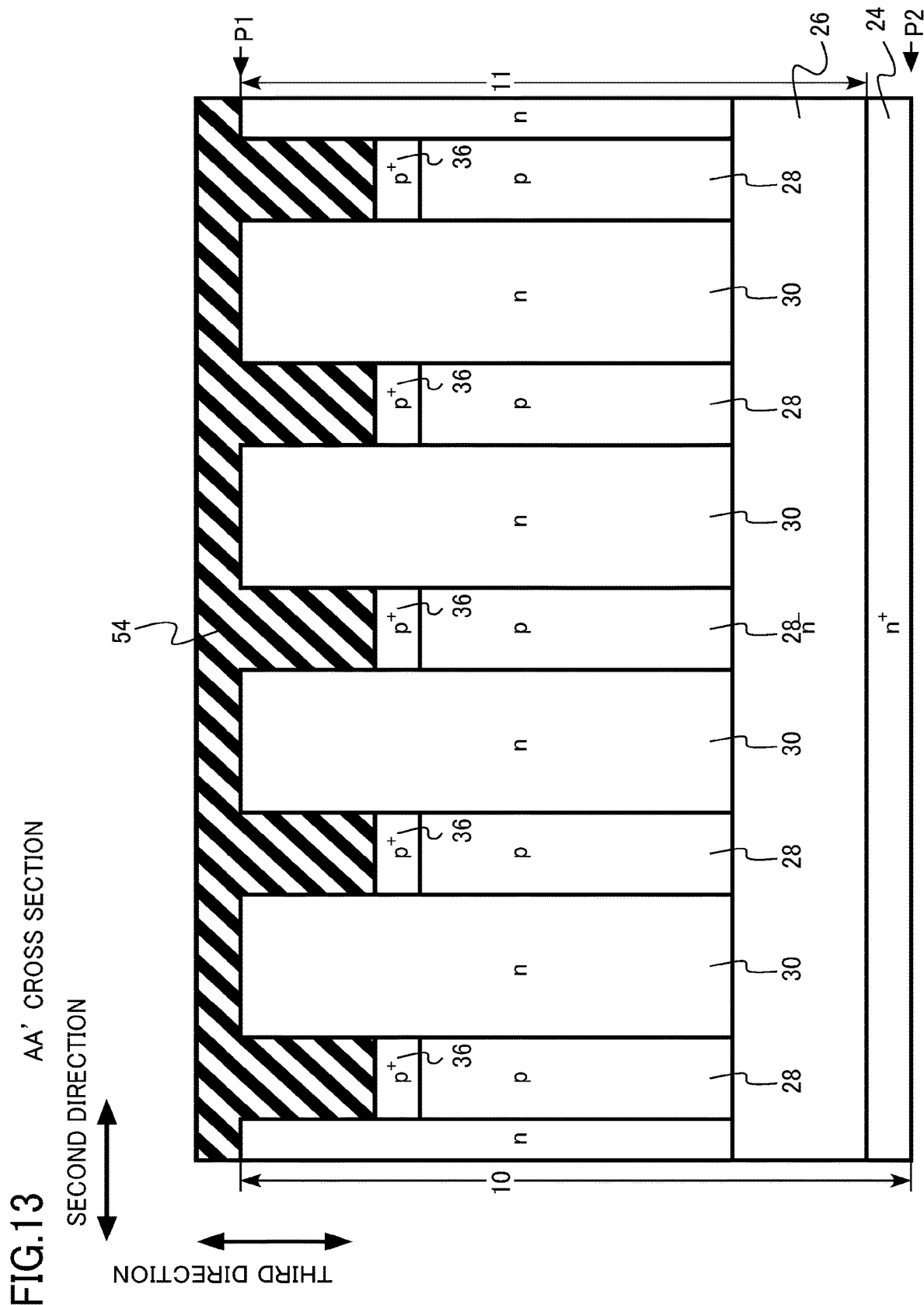
FIG. 13 is a schematic sectional view illustrating the example of the method for manufacturing the semiconductor device of the first embodiment.

Then, a sacrificial oxide layer 54 is formed by oxidizing the surface of the epitaxial layer 11 by a known process technique (FIG. 13). Since the oxidation rate of the high-concentration p-region 52 having a high impurity concentration is high, the sacrificial oxide layer 54 on the electric field relaxation region 36 is thickened.

Figure 14:
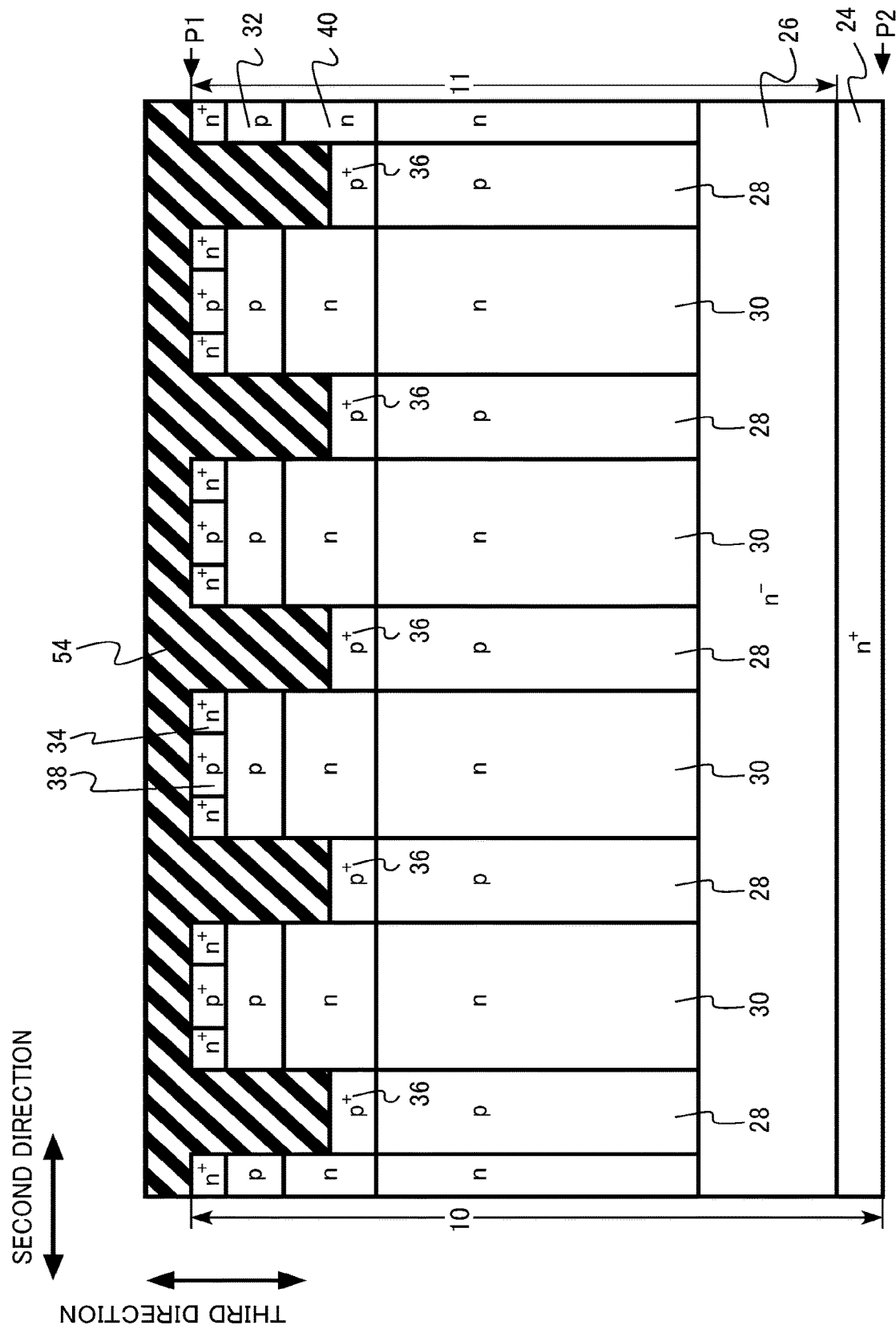
FIG. 14 is a schematic sectional view illustrating the example of the method for manufacturing the semiconductor device of the first embodiment.

Then, an n-type current spreading region 40, a p-type body region 32, an n$^+$-type source region 34, and a p$^+$-type contact region 38 are formed in the epitaxial layer 11 by ion implantation (FIG. 14).

Figure 15:
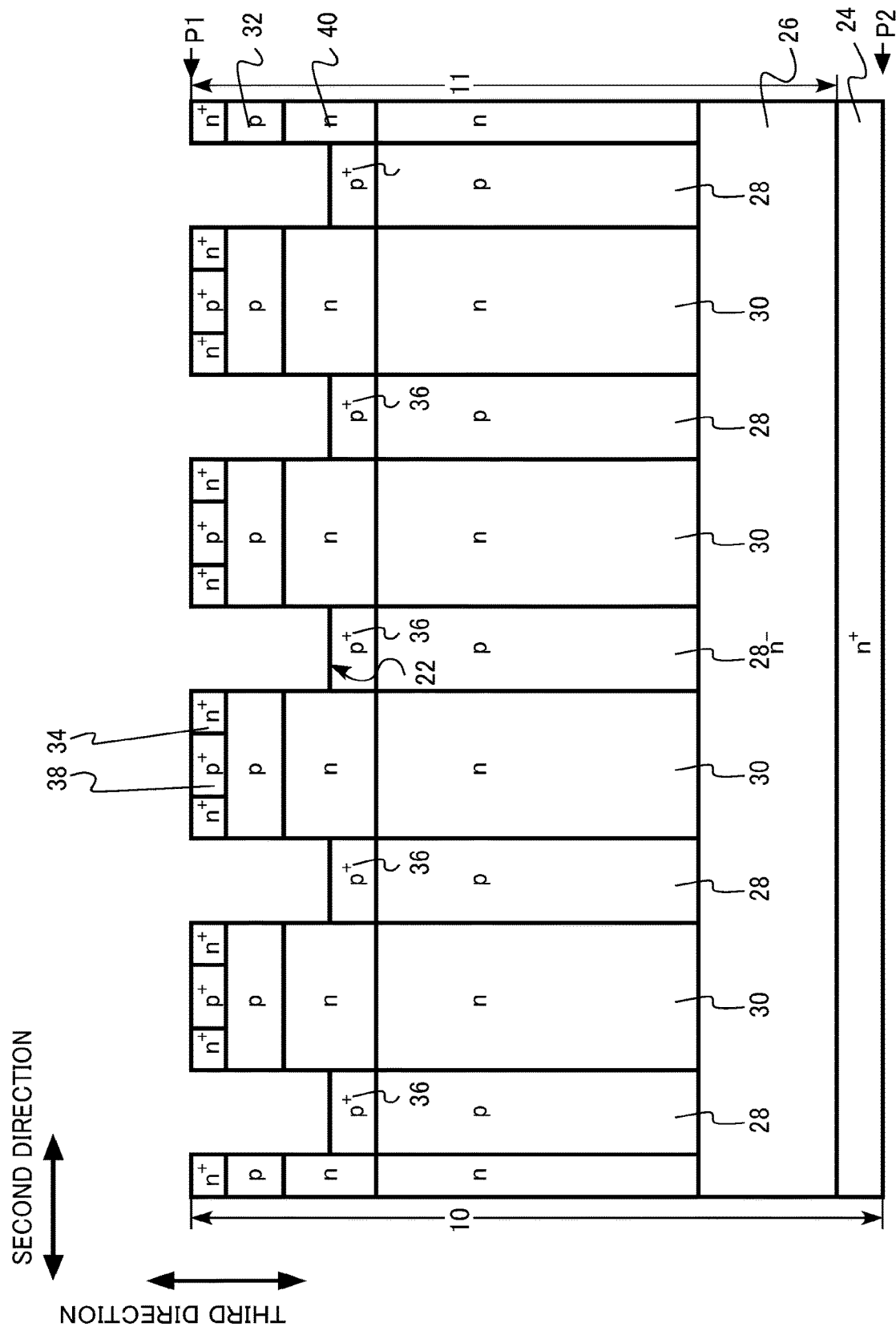
FIG. 15 is a schematic sectional view illustrating the example of the method for manufacturing the semiconductor device of the first embodiment.

Next, the sacrificial oxide layer 54 is removed by a known wet etching method. Thus, a gate trench 22 is formed (FIG. 15).

By ion implantation using the same mask material 50 as a mask, the p-pillar region 28, the electric field relaxation region 36, and the high-concentration p-region 52 are formed. Then, by selectively thickly oxidizing the high-concentration p-region 52 and then removing it, the gate trench 22 is formed. Thus, the p-pillar region 28 and the electric field relaxation region 36 are formed in a self-aligned manner (cell alignment) with respect to the gate trench 22.

Thus, it is possible for the position shift amount of both ends of the p-pillar region 28 in the second direction (the end E1 and the end E2 in FIG. 3) from both side planes of the gate trench 22 in the second direction (the first side plane SP1 and the second side plane SP2 in FIG. 3) to be, for example, ±0.1 μm or less. Furthermore, it is possible for the position shift amount of both ends of the electric field relaxation region 36 in the second direction (the end E3 and the end E4 in FIG. 3) from both side planes of the gate trench 22 in the second direction (the first side plane SP1 and the second side plane SP2 in FIG. 3) to be, for example, ±0.1 μm or less.

Figure 16:
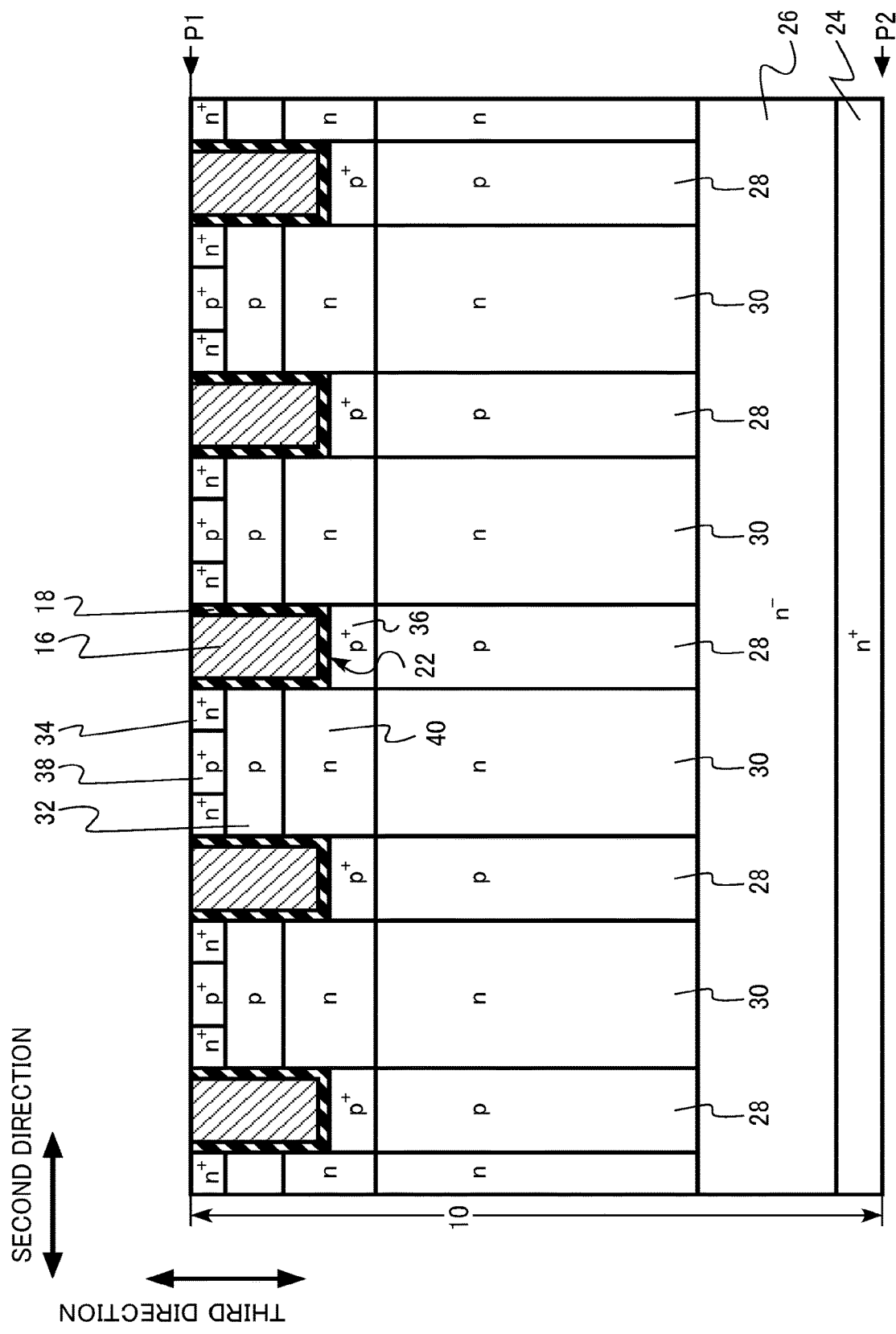
FIG. 16 is a schematic sectional view illustrating the example of the method for manufacturing the semiconductor device of the first embodiment.

Then, a gate insulating layer 18 and a gate electrode 16 are formed in the gate trench 22 by a known process technique (FIG. 16).

Thereafter, an interlayer insulating layer 20, a source electrode 12, and a drain electrode 14 are formed by a known process technique. The MOSFET 100 shown in FIG. 1 is manufactured by the above manufacturing method.

In the following, a function and an effect of the semiconductor device of the first embodiment will be described.

The MOSFET 100 has an SJ structure formed by the p-pillar region 28 and the n-pillar region 30. The SJ structure relaxes the electric field strength in the semiconductor by the depletion layer extending in the lateral direction in the p-pillar region 28 and the n-pillar region 30, and achieves a high breakdown voltage of the MOSFET 100. In addition, with the SJ structure, it is possible to increase the n-type impurity concentration of the n-pillar region 30. Thus, the on-resistance of the MOSFET 100 is reduced.

Furthermore, in the MOSFET 100, the p-pillar region 28 is formed immediately below the gate trench 22. Thus, the p-pillar region 28 does not inhibit the flow of electrons flowing from the source electrode 12 to the drain electrode 14 when the MOSFET 100 is turned on. In the MOSFET 100, it is possible for electrons flowing on the side plane of the gate trench 22 to flow straight to the n-pillar region 30 immediately below the body region 32. Thus, it is possible to prevent on-resistance due to the presence of the p-pillar region 28 from increasing. Thus, the on-resistance of the MOSFET 100 is further reduced.

In addition, by providing the electric field relaxation region 36 immediately below the gate trench 22, the electric field applied to the gate insulating layer 18 is reduced when the MOSFET 100 is turned off. Thus, the dielectric breakdown of the gate insulating layer 18 is suppressed. Accordingly, it is possible to implement a highly reliable MOSFET 100.

The position shift amount of both ends of the p-pillar region 28 in the second direction (the end E1 and the end E2 in FIG. 3) from both side planes of the gate trench 22 in the second direction (the first side plane SP1 and the second side plane SP2 in FIG. 3) is preferably, for example, ±0.1 μm or less. In addition, the position shift amount of both ends of the electric field relaxation region 36 in the second direction (the end E3 and the end E4 in FIG. 3) from both side planes of the gate trench 22 in the second direction (the first side plane SP1 and the second side plane SP2 in FIG. 3) is preferably, for example, ±0.1 μm or less.

Figure 17:
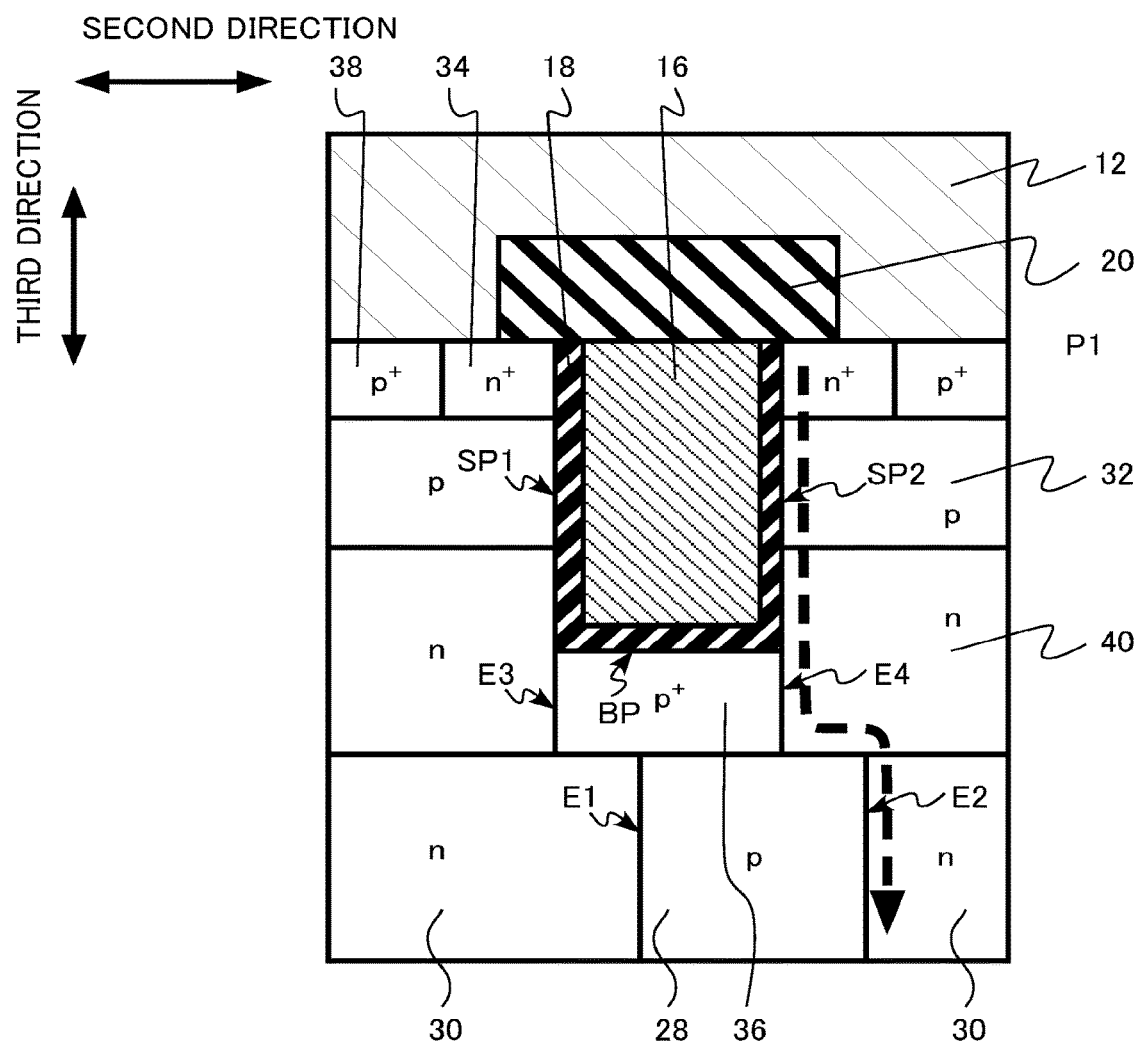
FIG. 17 is a diagram for explaining a function and an effect of the semiconductor device of the first embodiment.
Figure 18:
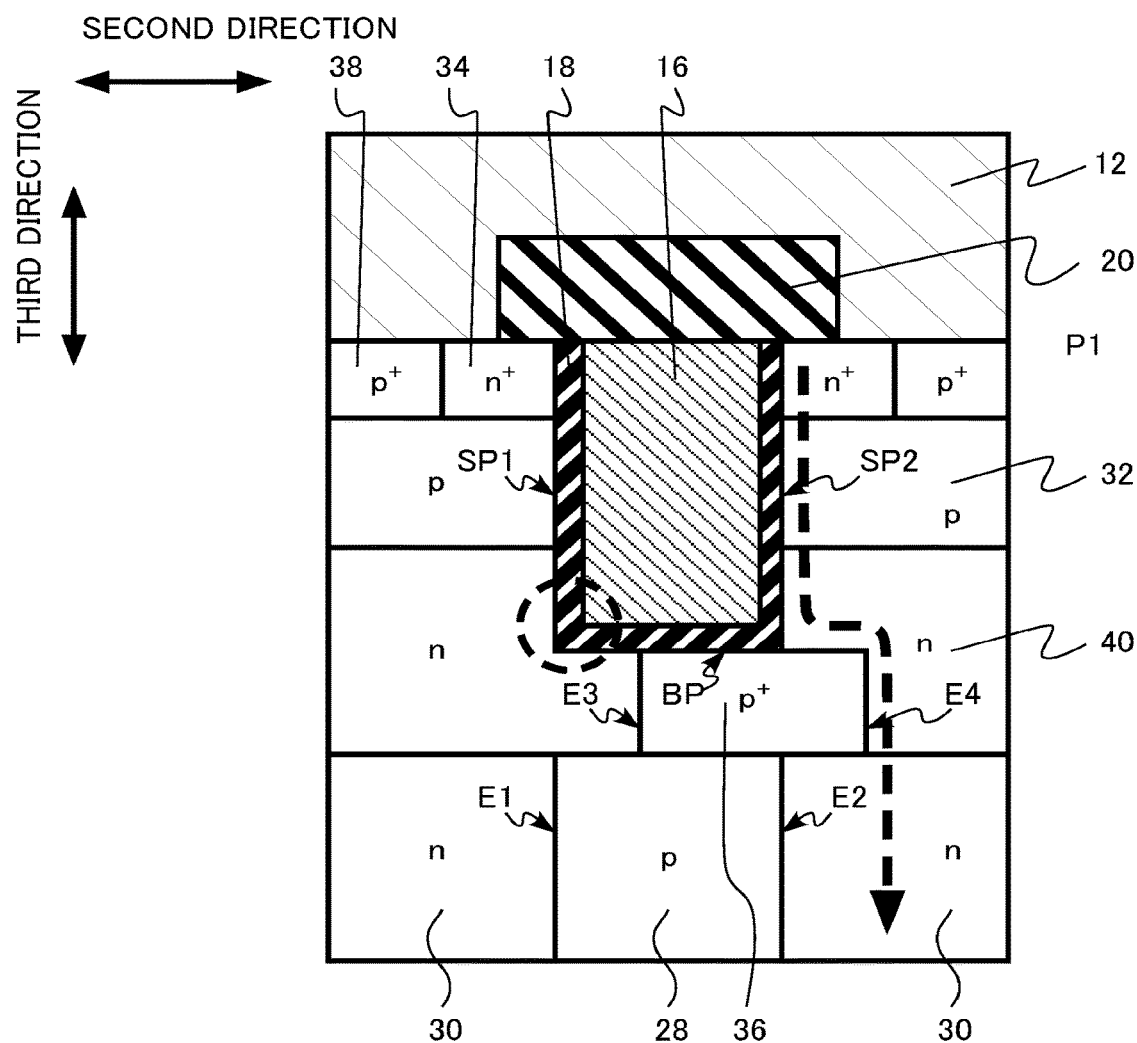
FIG. 18 is a diagram for explaining the function and the effect of the semiconductor device of the first embodiment.
Figure 19:
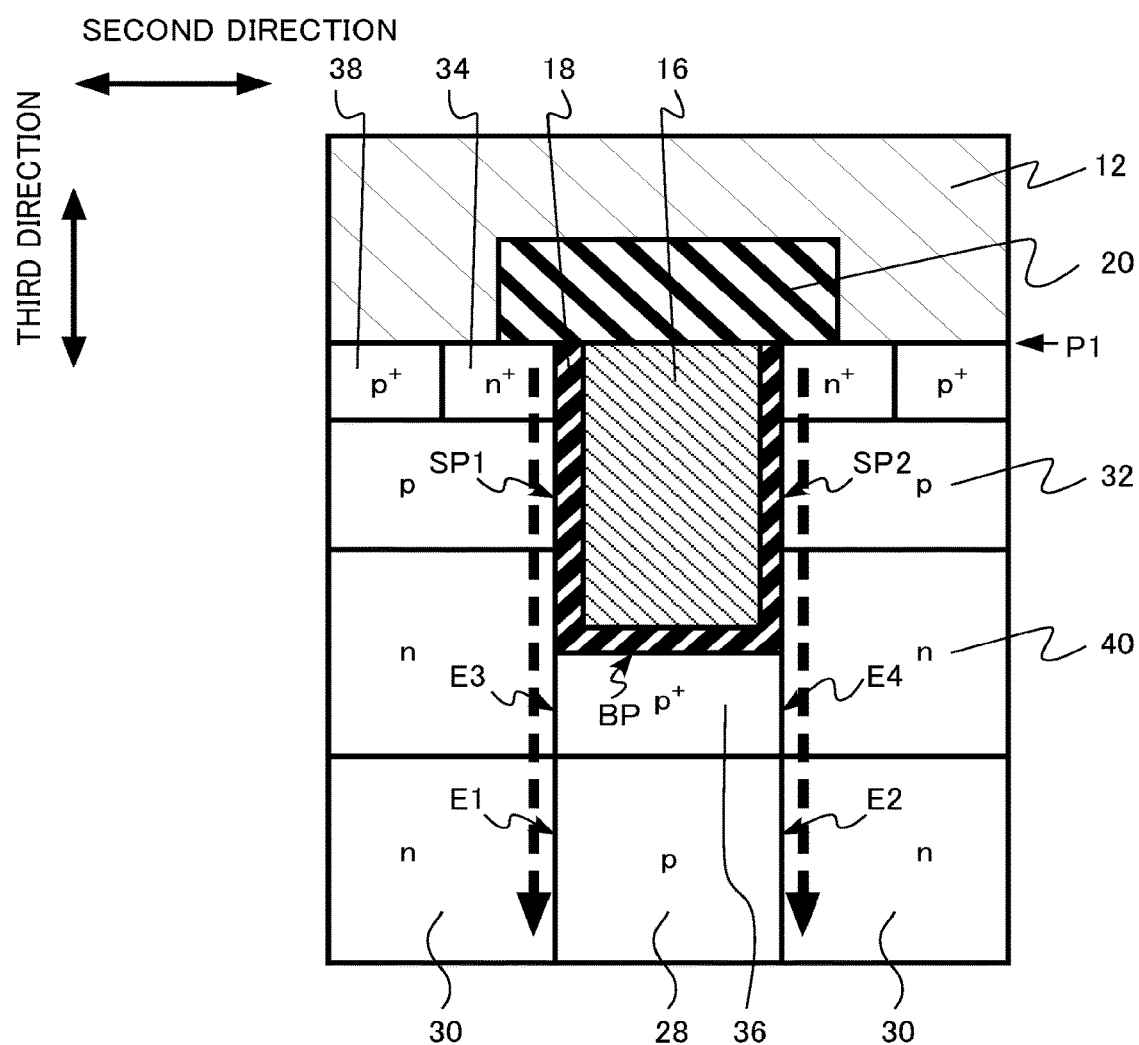
FIG. 19 is a diagram for explaining the function and the effect of the semiconductor device of the first embodiment.

FIGS. 17, 18, and 19 are diagrams for explaining the function and effect of the semiconductor device of the first embodiment. FIGS. 17, 18, and 19 correspond to FIG. 3.

FIG. 17 shows that the position shift amount of both ends of the p-pillar region 28 in the second direction (the end E1 and the end E2 in FIG. 17) from both side planes of the gate trench 22 in the second direction (the first side plane SP1 and the second side plane SP2 in FIG. 17) is large. In FIG. 17, the p-pillar region 28 is shifted to the right relative to the gate trench 22. For example, the shifting as shown in FIG. 17 can occur when the gate trench 22 is not formed in a self-aligned manner with respect to the p-pillar region 28.

In this case, the flow of electrons indicated by the dotted arrow in FIG. 17 when the MOSFET 100 is turned on is inhibited by the p-pillar region 28, and bypasses the p-pillar region 28. Thus, the on-resistance of MOSFET 100 increases.

For example, the same phenomenon can occur when the width of the p-pillar region 28 in the second direction is larger than the width of the gate trench 22 in the second direction.

FIG. 18 shows that the position shift amount of both ends of the electric field relaxation region 36 in the second direction (the end E3 and the end E4 in FIG. 18) from both side planes of the gate trench 22 in the second direction (the first side plane SP1 and the second side plane SP2 in FIG. 18) is large. In FIG. 18, the electric field relaxation region 36 is shifted to the right relative to the gate trench 22. For example, the shifting as shown in FIG. 18 can occur when the gate trench 22 is not formed in a self-aligned manner with respect to the electric field relaxation region 36.

In this case, the flow of electrons indicated by the dotted arrow in FIG. 18 when the MOSFET 100 is turned on is inhibited by the electric field relaxation region 36, and bypasses the electric field relaxation region 36. Thus, the on-resistance of MOSFET 100 increases.

For example, the on-resistance of the MOSFET 100 can increase when the width of the electric field relaxation region 36 in the second direction is larger than the width of the gate trench 22 in the second direction.

In the case of FIG. 18, since the electric field relaxation region 36 has not been formed immediately below the first side plane SP1, the electric field applied to the gate insulating layer 18 in the region enclosed by the dotted line in FIG. 18 increases. Thus, the dielectric breakdown of the gate insulating layer 18 can occur. Accordingly, the reliability of MOSFET 100 can decrease.

For example, when the width of the electric field relaxation region 36 in the second direction is smaller than the width of the gate trench 22 in the second direction, the electric field applied to the gate insulating layer 18 is increased, and the reliability of the MOSFET 100 can decrease.

FIG. 19 shows that the position shift amount of both ends of the p-pillar region 28 in the second direction (the end E1 and the end E2 in FIG. 19) from both side planes of the gate trench 22 in the second direction (the first side plane SP1 and the second side plane SP2 in FIG. 19) is zero. In addition, the position shift amount of both ends of the electric field relaxation region 36 in the second direction (the end E3 and the end E4 in FIG. 19) from both side planes of the gate trench 22 in the second direction (the first side plane SP1 and the second side plane SP2 in FIG. 19) is also zero.

The flow of electrons indicated by the dotted arrow in FIG. 19 is not inhibited by either the p-pillar region 28 or the electric field relaxation region 36. Thus, the on-resistance of the MOSFET 100 is reduced.

In addition, the position shift amount of both ends of the electric field relaxation region 36 in the second direction (the end E3 and the end E4 in FIG. 18) from both side planes of the gate trench 22 in the second direction (the first side plane SP1 and the second side plane SP2 in FIG. 18) is zero. Thus, the electric field applied to the gate insulating layer 18 from the electric field relaxation region 36 is relaxed. Accordingly, the reliability of MOSFET 100 is improved.

Since the position shift amount of both ends of the p-pillar region 28 in the second direction (the end E1 and the end E2 in FIG. 3) from both side planes of the gate trench 22 in the second direction (the first side plane SP1 and the second side plane SP2 in FIG. 3) is ±0.1 µm or less, the on-resistance of the MOSFET 100 is reduced.

In addition, since the position shift amount of both ends of the electric field relaxation region 36 in the second direction (the end E3 and the end E4 in FIG. 3) from both side planes of the gate trench 22 in the second direction (the first side plane SP1 and the second side plane SP2 in FIG. 3) is ±0.1 µm or less, the on-resistance of the MOSFET 100 is reduced. Furthermore, the reliability of MOSFET 100 is improved.

In the MOSFET 100, the length of the p-pillar region 28 in the third direction perpendicular to the first plane (d1 in FIG. 1) is longer than the depth of the gate trench 22 in the third direction (d2 in FIG. 1). Since the length d1 of the p-pillar region 28 in the third direction is long, the effect of improving the breakdown voltage due to the SJ structure is sufficiently exhibited, and the breakdown voltage of the MOSFET 100 is improved.

From the viewpoint of improving the breakdown voltage of the MOSFET 100, the aspect ratio (d1/W1) of the length d1 of the p-pillar region 28 in the third direction to the width of the p-pillar region 28 in the second direction (W1 in FIG. 1) is preferably 3 or more, more preferably 4 or more, and still more preferably 5 or more.

From the viewpoint of improving the breakdown voltage of the MOSFET 100, the length d1 of the p-pillar region 28 in the third direction perpendicular to the first plane is preferably 3 µm or more, more preferably 4 µm or more, and still more preferably 5 µm or more.

When the width of the p-pillar region 28 in the second direction is W1, the p-type impurity concentration of the p-pillar region 28 is N1, the width of the n-pillar region 30 in the second direction is W2, and the n-type impurity concentration of the n-pillar region 30 is N2, the relationship of the following expression is preferably satisfied.

$$0.8 \leq (W1 \times N1)/(W2 \times N2) \leq 1.2$$

By maintaining the above relational expression, it becomes easy to completely deplete the p-pillar region 28 and the n-pillar region 30 when the MOSFET 100 is turned off, and the breakdown voltage of the MOSFET 100 is further improved.

The p-type impurity concentration of the p-pillar region 28 is preferably $5 \times 10^{15}$ cm$^{-3}$ or more and $5 \times 10^{17}$ cm$^{-3}$ or less, and the n-type impurity concentration of the n-pillar region 30 is preferably $5 \times 10^{15}$ cm$^{-3}$ or more and $5 \times 10^{17}$ cm$^{-3}$ or less. Since the impurity concentration is in the above range, it becomes easy to completely deplete the p-pillar region 28 and the n-pillar region 30, and the breakdown voltage of the MOSFET 100 is further improved.

The MOSFET 100 preferably has the n-type current spreading region 40. With the low-resistance current spreading region 40, the flow of electrons from the body region 32 toward the n-pillar region 30 easily spreads in the lateral direction (second direction) when the MOSFET 100 is turned on. Thus, the on-resistance of the MOSFET 100 is further reduced.

From the viewpoint of reducing on-resistance, the n-type impurity concentration of the current spreading region 40 is preferably 1.5 times or more the n-type impurity concentration of the n-pillar region 30. In addition, from the viewpoint of improving the breakdown voltage, the n-type impurity concentration of the current spreading region 40 is preferably 5 times or less the n-type impurity concentration of the n-pillar region 30.

As described above, according to the first embodiment, it is possible to implement a MOSFET capable of reducing the on-resistance. Furthermore, according to the first embodiment, it is possible to implement a MOSFET capable of improving the breakdown voltage. Moreover, according to the first embodiment, it is possible to implement a MOSFET capable of improving the reliability.

Second Embodiment

A semiconductor device of a second embodiment is different from the semiconductor device of the first embodiment in that a silicon carbide layer does not include an eighth silicon carbide region and that a first silicon carbide region is in contact with a ninth silicon carbide region. Hereinafter, the description overlapping with the first embodiment will be partially omitted.

Figure 20:
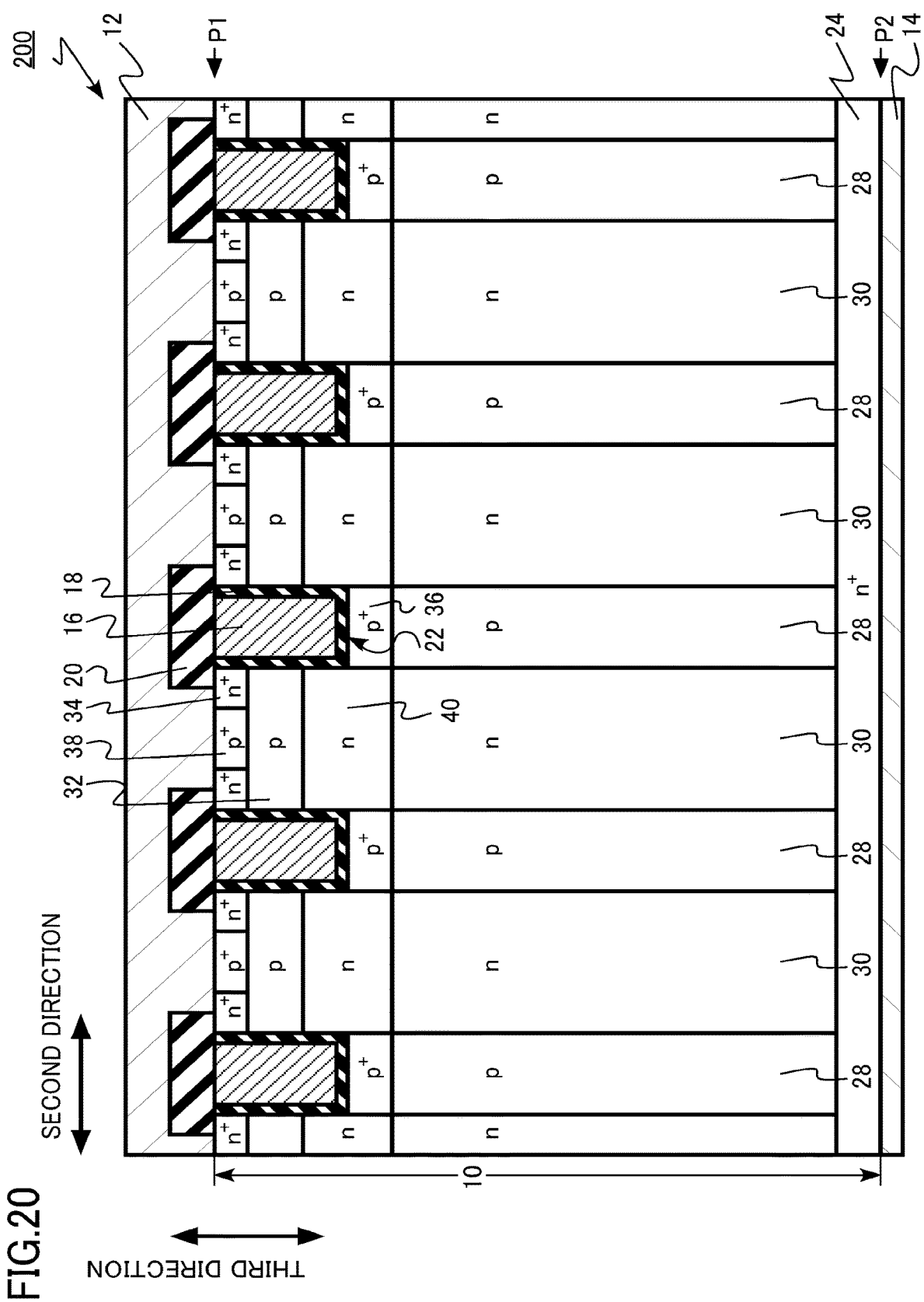
FIG. 20 is a schematic sectional view of a semiconductor device of a second embodiment.

FIG. 20 is a schematic sectional view of a semiconductor device of the second embodiment. The semiconductor device of the second embodiment is a trench-gate-type vertical MOSFET 200 using silicon carbide. The MOSFET 200 is an n-channel MOSFET using electrons as carriers. The MOSFET 200 has a super junction structure (SJ structure).

The MOSFET 200 includes a silicon carbide layer 10, a source electrode 12 (a first electrode), a drain electrode 14 (a second electrode), a gate electrode 16, a gate insulating layer 18, and an interlayer insulating layer 20.

The silicon carbide layer 10 includes a gate trench (a first trench), an n$^+$-type drain region 24 (a ninth silicon carbide region), a p-type p-pillar region 28 (a first silicon carbide region), an n-type n-pillar region 30 (a second silicon carbide region), a p-type body region 32 (a third silicon carbide region), an n$^+$-type source region (a fourth silicon carbide region), a p$^1$-type electric field relaxation region 36 (a fifth silicon carbide region), a p$^+$-type contact region 38, and an n-type current spreading region 40 (a seventh silicon carbide region).

The p-type p-pillar region 28 and the n-pillar region 30 are in contact with the drain region 24.

As described above, according to the second embodiment, it is possible to implement a MOSFET capable of reducing the on-resistance similarly to the first embodiment. Furthermore, according to the second embodiment, it is possible to implement a MOSFET capable of improving the breakdown voltage similarly to the first embodiment. Moreover, according to the second embodiment, it is possible to implement a MOSFET capable of improving the reliability similarly to the first embodiment.

Third Embodiment

A semiconductor device of a third embodiment is different from the semiconductor device of the first embodiment in that a silicon carbide layer is positioned on a first plane side, and includes a second trench extending in a first direction on the first plane and a p-type sixth silicon carbide region positioned between a part of a first silicon carbide region and the second trench the p-type sixth silicon carbide region having p-type impurity concentration higher than p-type impurity concentration of the first silicon carbide region, and that a part of a first electrode is positioned in the second trench. Hereinafter, the description overlapping with the first embodiment will be partially omitted.

Figure 21:
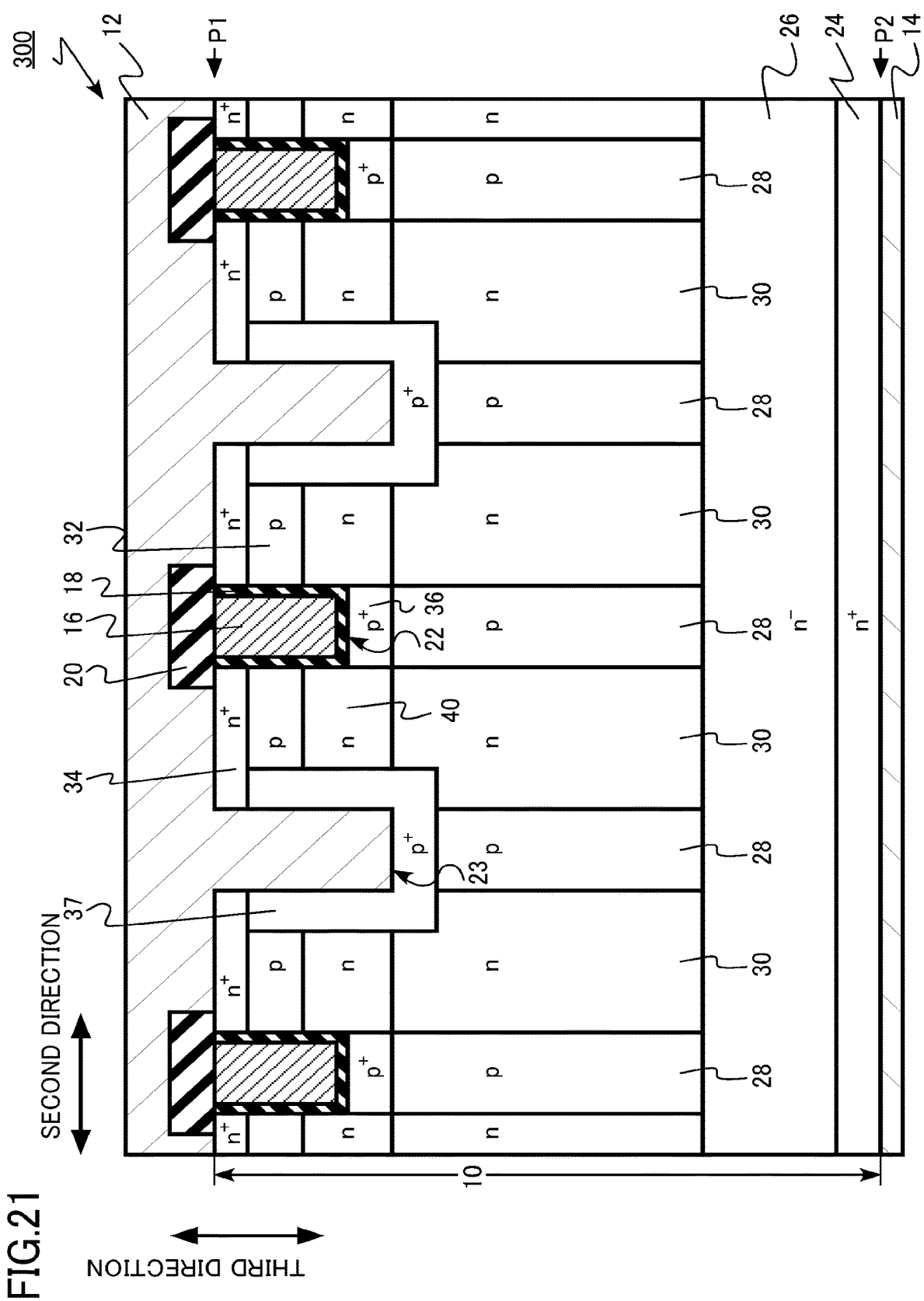
FIG. 21 is a schematic sectional view of a semiconductor device of a third embodiment.

FIG. 21 is a schematic sectional view of the semiconductor device of the third embodiment. The semiconductor device of the third embodiment is a trench-gate-type vertical MOSFET 300 using silicon carbide. The MOSFET 300 is an n-channel MOSFET using electrons as carriers. The MOSFET 300 has a super junction structure (SJ structure).

The MOSFET 300 includes a silicon carbide layer 10, a source electrode 12 (a first electrode), a drain electrode 14 (a second electrode), a gate electrode 16, a gate insulating layer 18, and an interlayer insulating layer 20.

The silicon carbide layer 10 includes a gate trench (a first trench), a source trench 23 (a second trench), an n$^+$-type drain region 24 (a ninth silicon carbide region), a p-type p-pillar region 28 (a first silicon carbide region), an n-type n-pillar region 30 (a second silicon carbide region), a p-type body region 32 (a third silicon carbide region), an n$^+$-type source region 34 (a fourth silicon carbide region), a p$^+$-type electric field relaxation region 36 (a fifth silicon carbide region), a p$^+$-type deep-electric-field relaxation region 37 (a sixth silicon carbide region), and an n-type current spreading region 40 (a seventh silicon carbide region).

The source trench 23 is in the silicon carbide layer 10. The source trench 23 is positioned on a first plane P1 side of the silicon carbide layer 10. The source trench 23 is a groove formed in the silicon carbide layer 10. The depth of the source trench 23 is deeper than the depth of the gate trench 22, for example.

The source trench 23 is positioned between two gate trenches 22. The source trench 23 is repeatedly disposed in the second direction.

A part of the source electrode 12 is positioned in the source trench 23. For example, the part of the source electrode 12 is in contact with the source region 34 on the side plane of the source trench 23.

The p$^+$-type deep-electric-field relaxation region 37 is positioned between a part of the p-pillar region 28 and the source trench 23. The deep-electric-field relaxation region 37 is positioned between the source trench 23 and the p-pillar region 28 adjacent to the p-pillar region 28 sandwiching the electric field relaxation region 36 with the gate trench 22.

The deep-electric-field relaxation region 37 is in contact with the bottom plane of the source trench 23. The deep-electric-field relaxation region 37 is in contact with the p-pillar region 28.

The deep-electric-field relaxation region 37 has a function of relaxing the electric field applied to the gate insulating layer 18 when the MOSFET 300 is turned off. The deep-electric-field relaxation region 37 is fixed at the same potential as the source electrode 12.

The deep-electric-field relaxation region 37 contains, for example, aluminum (Al) as a p-type impurity. The p-type impurity concentration of the deep-electric-field relaxation region 37 is higher than the p-type impurity concentration of the p-pillar region 28. The p-type impurity concentration of the deep-electric-field relaxation region 37 is, for example, 10 times or more the p-type impurity concentration of the p-pillar region 28. The p-type impurity concentration of the deep-electric-field relaxation region 37 is, for example, $5 \times 10^{17}$ cm$^{-3}$ or more and $5 \times 10^{19}$ cm$^{-3}$ or less.

The distance between a second plane P2 and the deep-electric-field relaxation region 37 is smaller than the distance between the second plane P2 and the electric field relaxation region 36, for example. In other words, the depth of the deep-electric-field relaxation region 37 is deeper than the depth of the electric field relaxation region 36, for example.

With the deep-electric-field relaxation region 37 in addition to the electric field relaxation region 36, the electric field applied to the gate insulating layer 18 is further relaxed. Accordingly, the reliability of MOSFET 300 is further improved.

From the viewpoint of relaxing the electric field applied to the gate insulating layer 18, the distance between the second plane P2 and the deep-electric-field relaxation region 37 is preferably smaller than the distance between the second plane P2 and the electric field relaxation region 36. In other words, the depth of the deep-electric-field relaxation region 37 is preferably deeper than the depth of the electric field relaxation region 36.

As described above, according to the third embodiment, it is possible to implement a MOSFET capable of reducing the on-resistance similarly to the first embodiment. Furthermore, according to the third embodiment, it is possible to implement a MOSFET capable of improving the breakdown voltage similarly to the first embodiment. Moreover, according to the third embodiment, with the deep-electric-field relaxation region 37, it is possible to implement a MOSFET capable of further improving the reliability.

Fourth Embodiment

A semiconductor device of a fourth embodiment is different from the semiconductor device of the third embodiment in that a part of a junction between a part of a first electrode and a silicon carbide layer is a Schottky junction. Hereinafter, the description overlapping with the first and third embodiments will be partially omitted.

Figure 22:
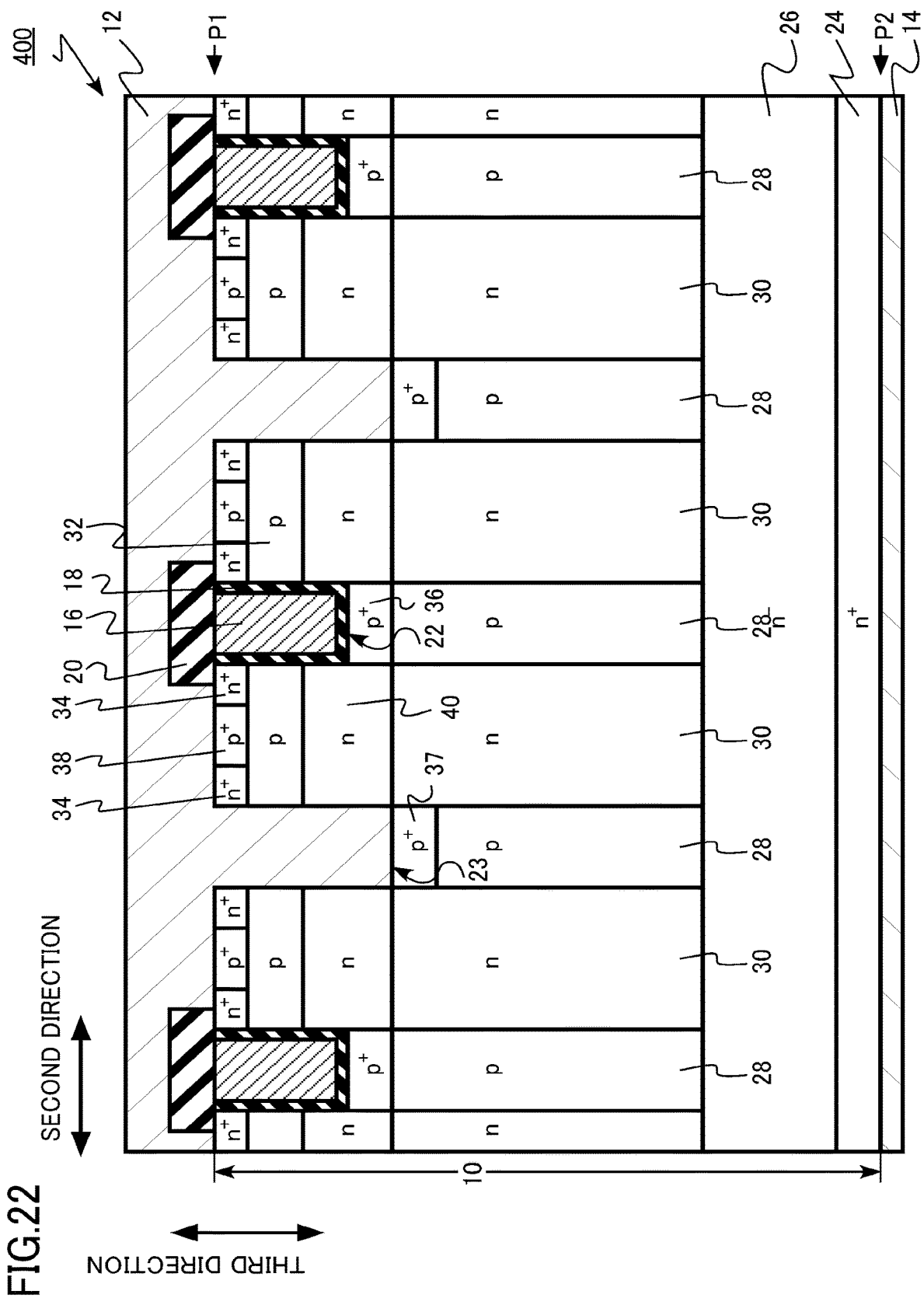
FIG. 22 is a schematic sectional view of a semiconductor device of a fourth embodiment.

FIG. 22 is a schematic sectional view of the semiconductor device of the fourth embodiment. The semiconductor device of the fourth embodiment is a trench-gate-type vertical MOSFET 400 using silicon carbide. The MOSFET 400 is an n-channel MOSFET using electrons as carriers. The MOSFET 400 has a super junction structure (SJ structure). The MOSFET 400 includes a Schottky barrier diode (SBD).

The MOSFET 400 includes a silicon carbide layer 10, a source electrode 12 (a first electrode), a drain electrode 14 (a second electrode), a gate electrode 16, a gate insulating layer 18, and an interlayer insulating layer 20.

The silicon carbide layer 10 includes a gate trench (a first trench), a source trench 23 (a second trench), an n$^+$-type drain region 24 (a ninth silicon carbide region), a p-type p-pillar region 28 (a first silicon carbide region), an n-type n-pillar region 30 (a second silicon carbide region), a p-type body region 32 (a third silicon carbide region), an n$^+$-type source region 34 (a fourth silicon carbide region), a p$^+$-type electric field relaxation region 36 (a fifth silicon carbide region), a p$^+$-type deep-electric-field relaxation region 37 (a sixth silicon carbide region), a p$^+$-type contact region 38, and an n-type current spreading region 40 (a seventh silicon carbide region).

The source trench 23 is in the silicon carbide layer 10. The source trench 23 is positioned on a first plane P1 side of the silicon carbide layer 10. The source trench 23 is a groove formed in the silicon carbide layer 10. The depth of the source trench 23 is deeper than the depth of the gate trench 22, for example.

The source trench 23 is positioned between two gate trenches 22. The source trench 23 is repeatedly disposed in the second direction.

A part of the source electrode 12 is positioned in the source trench 23. For example, the part of the source electrode 12 is in contact with the source region 34 on the side plane of the source trench 23.

A part of the source electrode 12 is in contact with the current spreading region 40 on the side plane of the source trench 23. The junction between the source electrode 12 and the current spreading region 40 is a Schottky junction. The MOSFET 400 includes a Schottky barrier diode (SBD).

The SBD included in the MOSFET 400 functions as a freewheeling diode when the MOSFET 400 is used in a power conversion circuit, for example. Thus, when the MOSFET 400 is used in a power conversion circuit, an SBD does not need to be attached externally as a freewheeling diode. Accordingly, with the MOSFET 400, it is possible to reduce the size of the power conversion circuit.

The p$^+$-type deep-electric-field relaxation region 37 is positioned between a part of the p-pillar region 28 and the source trench 23. The deep-electric-field relaxation region 37 is positioned between the source trench 23 and the p-pillar region 28 adjacent to the p-pillar region 28 sandwiching the electric field relaxation region 36 with the gate trench 22.

The deep-electric-field relaxation region 37 is in contact with the bottom plane of the source trench 23. The deep-electric-field relaxation region 37 is in contact with the p-pillar region 28.

The deep-electric-field relaxation region 37 has a function of relaxing the electric field applied to the gate insulating layer 18 when the MOSFET 400 is turned off. The deep-electric-field relaxation region 37 is fixed at the same potential as the source electrode 12.

The deep-electric-field relaxation region 37 contains, for example, aluminum (Al) as a p-type impurity. The p-type impurity concentration of the deep-electric-field relaxation region 37 is higher than the p-type impurity concentration of the p-pillar region 28. The p-type impurity concentration of the deep-electric-field relaxation region 37 is, for example, 10 times or more the p-type impurity concentration of the p-pillar region 28. The p-type impurity concentration of the deep-electric-field relaxation region 37 is, for example, $5 \times 10^{17}$ cm$^{-3}$ or more and $5 \times 10^{19}$ cm$^{-3}$ or less.

The distance between a second plane P2 and the deep-electric-field relaxation region 37 is smaller than the distance between the second plane P2 and the electric field relaxation region 36, for example. In other words, the depth of the deep-electric-field relaxation region 37 is deeper than the depth of the electric field relaxation region 36, for example.

With the deep-electric-field relaxation region 37 in addition to the electric field relaxation region 36, the electric field applied to the gate insulating layer 18 is further relaxed. Accordingly, the reliability of MOSFET 400 is further improved.

From the viewpoint of relaxing the electric field applied to the gate insulating layer 18, the distance between the second plane P2 and the deep-electric-field relaxation region 37 is preferably smaller than the distance between the second plane P2 and the electric field relaxation region 36. In other words, the depth of the deep-electric-field relaxation region 37 is preferably deeper than the depth of the electric field relaxation region 36.

As described above, according to the fourth embodiment, it is possible to implement a MOSFET capable of reducing the on-resistance similarly to the first embodiment. Furthermore, according to the fourth embodiment, it is possible to implement a MOSFET capable of improving the breakdown voltage similarly to the first embodiment. Moreover, according to the fourth embodiment, with the deep-electric-field relaxation region 37, it is possible to implement a MOSFET capable of further improving the reliability. In addition, according to the fourth embodiment, by including the SBD, it is possible to reduce the size of the power conversion circuit, for example.

Fifth Embodiment

A drive device including an inverter circuit of a fifth embodiment is drive device including the semiconductor device of the first embodiment.

Figure 23:
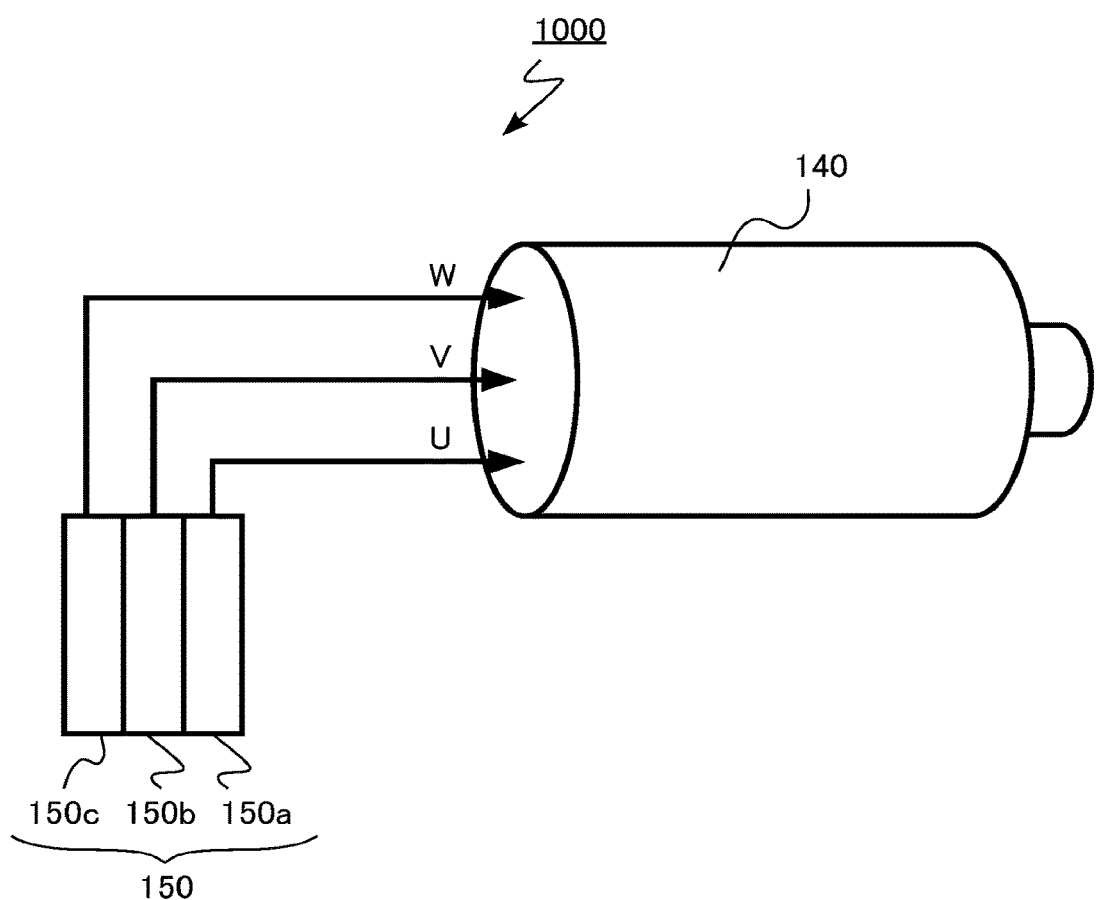
FIG. 23 is a schematic diagram illustrating a drive device of a fifth embodiment.

FIG. 23 is a schematic diagram illustrating the drive device of the fifth embodiment. A drive device 1000 includes a motor 140 and an inverter circuit 150.

The inverter circuit 150 includes three semiconductor modules 150a, 150b, and 150c each having the MOSFET 100 of the first embodiment as a switching element. By connecting the three semiconductor modules 150a, 150b, and 150c in parallel, the three-phase inverter circuit 150 including three AC voltage output terminals U, V, and W is implemented. The motor 140 is driven by the AC voltage output from the inverter circuit 150.

According to the fifth embodiment, with the MOSFET 100 having improved properties, it is possible to improve the properties of the inverter circuit 150 and the drive device 1000.

Sixth Embodiment

A vehicle of a sixth embodiment is a vehicle including the semiconductor device of the first embodiment.

Figure 24:
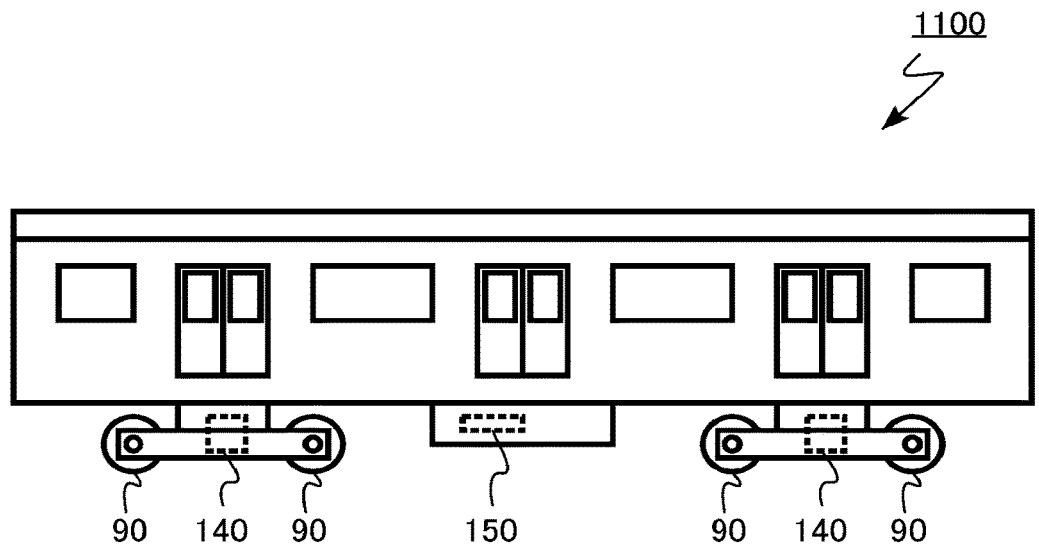
FIG. 24 is a schematic diagram illustrating a vehicle of a sixth embodiment.

FIG. 24 is a schematic diagram of the vehicle of the sixth embodiment. A vehicle 1100 of the sixth embodiment is a railway vehicle. The vehicle 1100 includes a motor 140 and an inverter circuit 150.

The inverter circuit 150 includes three semiconductor modules each having the MOSFET 100 of the first embodiment as a switching element. By connecting the three semiconductor modules in parallel, the three-phase inverter circuit 150 including three AC voltage output terminals U, V, and W is implemented. The motor 140 is driven by the AC voltage output from the inverter circuit 150. The wheels 90 of the vehicle 1100 are rotated by the motor 140.

According to the sixth embodiment, with the MOSFET 100 having improved properties, it is possible to improve the properties of the vehicle 1100.

Seventh Embodiment

A vehicle of a seventh embodiment is a vehicle including the semiconductor device of the first embodiment.

Figure 25:
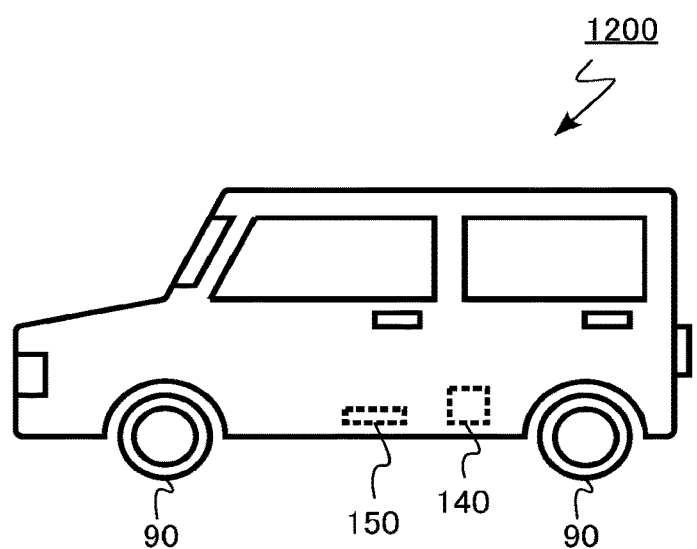
FIG. 25 is a schematic diagram illustrating a vehicle of a seventh embodiment.

FIG. 25 is a schematic diagram of the vehicle of the seventh embodiment. A vehicle 1200 of the seventh embodiment is an automobile. The vehicle 1200 includes a motor 140 and an inverter circuit 150.

The inverter circuit 150 includes three semiconductor modules each having the MOSFET 100 of the first embodiment as a switching element. By connecting the three semiconductor modules in parallel, the three-phase inverter circuit 150 including three AC voltage output terminals U, V, and W is implemented.

The motor 140 is driven by the AC voltage output from the inverter circuit 150. Wheels 90 of the vehicle 1200 are rotated by the motor 140.

According to the seventh embodiment, with the MOSFET 100 having improved properties, it is possible to improve the properties of the vehicle 1200.

Eighth Embodiment

An elevator of an eighth embodiment is an elevator including the semiconductor device of the first embodiment.

Figure 26:
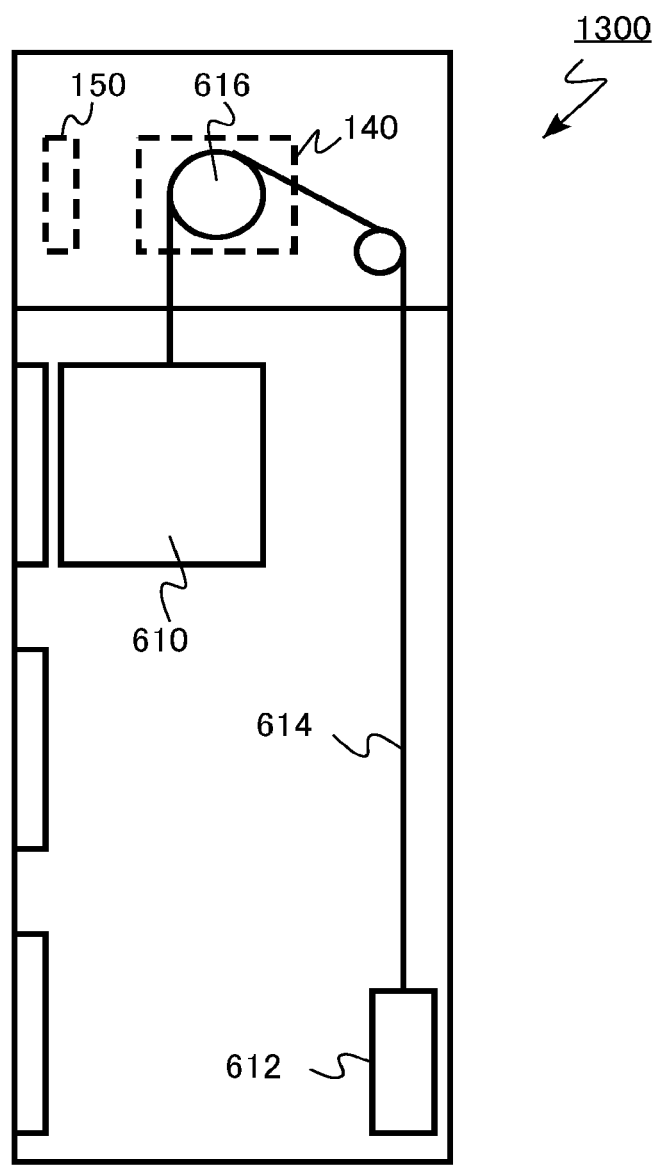
FIG. 26 is a schematic diagram illustrating an elevator of an eighth embodiment.

FIG. 26 is a schematic diagram of the elevator of the eighth embodiment. An elevator 1300 of the eighth embodiment includes a car 610, a counterweight 612, a wire rope 614, a hoist 616, a motor 140, and an inverter circuit 150.

The inverter circuit 150 includes three semiconductor modules each having the MOSFET 100 of the first embodiment as a switching element. By connecting the three semiconductor modules in parallel, the three-phase inverter circuit 150 including three AC voltage output terminals U, V, and W is implemented.

The motor 140 is driven by the AC voltage output from the inverter circuit 150. The hoist 616 is rotated by the motor 140, and the car 610 is moved up and down.

According to the eighth embodiment, with the MOSFET 100 having improved properties, it is possible to improve the properties of the elevator 1300.

As described above, in the first to fourth embodiments, while it has been described the case where a crystal structure of silicon carbide is 4H—SiC, the present disclosure is applicable to silicon carbide having a 6H—SiC, 3C—SiC, or other crystal structure.

In the fifth to eighth embodiments, the cases where the semiconductor device of the first embodiment is included has been described as examples. However, the semiconductor devices of the second to fourth embodiments may be applied.

In the fifth to eighth embodiments, the cases where the semiconductor device of the present disclosure is applied to a vehicle and an elevator have been described as examples. However, the semiconductor device of the present disclosure is applicable to a power conditioner in a photovoltaic power system, or the like.

While certain embodiments have been described, these embodiments have been presented by way of example only, and are not intended to limit the scope of the inventions. Indeed, a semiconductor device, an inverter circuit, a drive device, a vehicle, and an elevator described herein may be embodied in a variety of other forms; furthermore, various omissions, substitutions and changes in the form of the devices and methods described herein may be made without departing from the spirit of the inventions. The accompanying claims and their equivalents are intended to cover such forms or modifications as would fall within the scope and spirit of the inventions.

What is claimed is:

1. A semiconductor device comprising:
a first electrode;
a second electrode;
a silicon carbide layer positioned between the first electrode and the second electrode, the silicon carbide layer having a first plane parallel to a first direction and a second direction intersecting the first direction, and a second plane parallel to the first direction and the second direction, the second plane facing the first plane, and the silicon carbide layer including:
a first trench positioned on a first plane side, the first trench extending in the first direction on the first plane;
first silicon carbide regions of p-type and second silicon carbide regions of n-type alternately disposed in the second direction;
a third silicon carbide region of p-type positioned between at least one of the second silicon carbide regions of n-type and the first plane;
a fourth silicon carbide region of n-type positioned between the third silicon carbide region of p-type and the first plane; and
a fifth silicon carbide region of p-type positioned between at least one of the first silicon carbide regions of p-type and the first trench, the fifth silicon carbide region of p-type having p-type impurity concentration higher than p-type impurity concentration of the at least one of the first silicon carbide regions of p-type;
a gate electrode positioned in the first trench; and
a gate insulating layer positioned between the gate electrode and the silicon carbide layer, wherein
a length of the at least one of the first silicon carbide regions of p-type in a third direction perpendicular to the first plane is longer than a depth of the first trench in the third direction.

2. The semiconductor device according to claim 1, wherein an aspect ratio of the length of the at least one of the first silicon carbide regions of p-type in the third direction to a width of the at least one of the first silicon carbide regions of p-type in the second direction is 3 or more.

3. The semiconductor device according to claim 1, wherein the length of the at least one of the first silicon carbide regions of p-type in the third direction is 3 μm or more.

4. The semiconductor device according to claim 1, wherein a position shift amount of both ends of the at least one of the first silicon carbide regions of p-type in the second direction from both side planes of the first trench in the second direction is ±0.1 μm or less.

5. The semiconductor device according to claim 1, wherein a position shift amount of both ends of the fifth silicon carbide region of p-type in the second direction from both side planes of the first trench in the second direction is ±0.1 μm or less.

6. The semiconductor device according to claim 1, wherein the p-type impurity concentration of the fifth silicon carbide region of p-type is 10 times or more the p-type impurity concentration of the at least one of the first silicon carbide regions of p-type.

7. The semiconductor device according to claim 1, wherein a relationship of a following expression is satisfied:

$$0.8 \le (W1 \times N1)/(W2 \times N2) \le 1.2$$

where W1 is a width of the at least one of the first silicon carbide regions of p-type in the second direction, N1 is the p-type impurity concentration of the at least one of the first silicon carbide regions of p-type, W2 is a width of the at least one of the second silicon carbide regions of n-type in the second direction, and N2 is n-type impurity concentration of the at least one of the second silicon carbide regions of n-type.

8. The semiconductor device according to claim 1, wherein the p-type impurity concentration of the at least one of the first silicon carbide regions of p-type is $5 \times 10^{15}$ cm$^{-3}$ or more and $5 \times 10^{17}$ cm$^{-3}$ or less, and n-type impurity concentration of the at least one of the second silicon carbide regions of n-type is $5 \times 10^{15}$ cm$^{-3}$ or more and $5 \times 10^{17}$ cm$^{-3}$ or less.

9. The semiconductor device according to claim 1, wherein
the silicon carbide layer further includes:
a second trench positioned on the first plane side, the second trench extending in the first direction on the first plane; and
a sixth silicon carbide region of p-type positioned between the second trench and another one of the first silicon carbide regions of p-type adjacent to the at least one of the first silicon carbide regions of p-type, the sixth silicon carbide region of p-type having p-type impurity concentration higher than the p-type impurity concentration of the another one of the first silicon carbide regions of p-type, and a part of the first electrode is positioned in the second trench.

10. The semiconductor device according to claim 9, wherein a distance between the second plane and the sixth silicon carbide region of p-type is smaller than a distance between the second plane and the fifth silicon carbide region of p-type.

11. The semiconductor device according to claim 9, wherein a part of a junction between the part of the first electrode and the silicon carbide layer is a Schottky junction.

12. The semiconductor device according to claim 1, wherein the silicon carbide layer includes a sixth silicon carbide region of n-type positioned between the at least one of the second silicon carbide regions of n-type and the third silicon carbide region of p-type, and the seventh sixth silicon carbide region of n-type has n-type impurity concentration higher than n-type impurity concentration of the at least one of the second silicon carbide regions of n-type.

13. The semiconductor device according to claim 1, wherein the silicon carbide layer includes a sixth silicon carbide region of n-type positioned between the second plane and the at least one of the first silicon carbide regions of p-type and between the second plane and the at least one of the second silicon carbide regions of n-type, the sixth silicon carbide region of n-type has n-type impurity concentration lower than n-type impurity concentration of the at least one of the second silicon carbide regions of n-type.

14. The semiconductor device according to claim 1, wherein the silicon carbide layer includes a sixth silicon carbide region of n-type positioned between the second plane and the at least one of the first silicon carbide regions of p-type and between the second plane and the at least one of the second silicon carbide regions of n-type, the sixth silicon carbide region of n-type has n-type impurity concentration higher than n-type impurity concentration of the at least one of the second silicon carbide regions of n-type, and the at least one of the first silicon carbide region of p-type is in contact with the sixth silicon carbide region of n-type.

15. An inverter circuit comprising the semiconductor device according to claim 1.

16. A drive device comprising the semiconductor device according to claim 1.

17. A vehicle comprising the semiconductor device according to claim 1.

18. An elevator comprising the semiconductor device according to claim 1.

* * * * *